(12) United States Patent
Tamai

(10) Patent No.: US 6,313,469 B1
(45) Date of Patent: Nov. 6, 2001

(54) SUBSTRATE HANDLING APPARATUS AND ION IMPLANTATION APPARATUS

(75) Inventor: Tadamoto Tamai, Fujisawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/266,893

(22) Filed: Mar. 12, 1999

(30) Foreign Application Priority Data

| Mar. 13, 1998 | (JP) | 10-082547 |
|---|---|---|
| Mar. 13, 1998 | (JP) | 10-082548 |
| Mar. 13, 1998 | (JP) | 10-082549 |
| Mar. 17, 1998 | (JP) | 10-088001 |
| Mar. 17, 1998 | (JP) | 10-088002 |

(51) Int. Cl.$^7$ .................................................. H01J 37/317
(52) U.S. Cl. .............................. 250/442.11; 250/441.11; 250/492.11
(58) Field of Search ................... 250/442.11, 443.1, 250/441.11, 440.11, 492.21; 414/217, 222, 225

(56) References Cited

U.S. PATENT DOCUMENTS

| 4,700,077 | * | 10/1987 | Dykstra et al. | 250/441.11 |
|---|---|---|---|---|
| 4,705,951 | * | 11/1987 | Layman et al. | 250/442.11 |
| 4,724,325 | * | 2/1988 | Armstrong et al. | 250/442.11 |
| 4,836,733 | * | 7/1989 | Hertel et al. | 250/441.11 |
| 4,975,586 | * | 12/1990 | Ray | 250/440.11 |
| 5,003,183 | | 3/1991 | Nogami et al. | |
| 5,308,989 | * | 5/1994 | Brubaker | 250/441.11 |
| 5,357,115 | * | 10/1994 | Asakawa et al. | 250/442.11 |
| 5,883,932 | * | 3/1999 | Chiba et al. | 250/442.11 |
| 5,929,456 | * | 7/1999 | Tamai | 250/442.11 |

FOREIGN PATENT DOCUMENTS

| 3-154791 | 7/1991 | (JP) . |
|---|---|---|
| 9-38875 | 2/1997 | (JP) . |

* cited by examiner

Primary Examiner—Kiet T. Nguyen
(74) Attorney, Agent, or Firm—Armstrong, Westerman, Hattori, McLeland & Naughton, LLP

(57) ABSTRACT

An ion implantation apparatus has a vacuum chamber, a beam exposure region defined in an end of the vacuum chamber, and a pair of substrate holding robots disposed one on each side of the beam exposure region, each for holding a semiconductor wafer to allow the semiconductor wafer to be exposed to a beam in the beam exposure region. A pair of load-lock chambers is disposed in an opposite end of the vacuum chamber in confrontation with the substrate holding robots, respectively. A pair of feed robots is disposed between the load-lock chambers and the substrate holding robots, respectively. The vacuum chamber houses a relay table disposed between the feed robots, for relaying a semiconductor wafer.

2 Claims, 20 Drawing Sheets

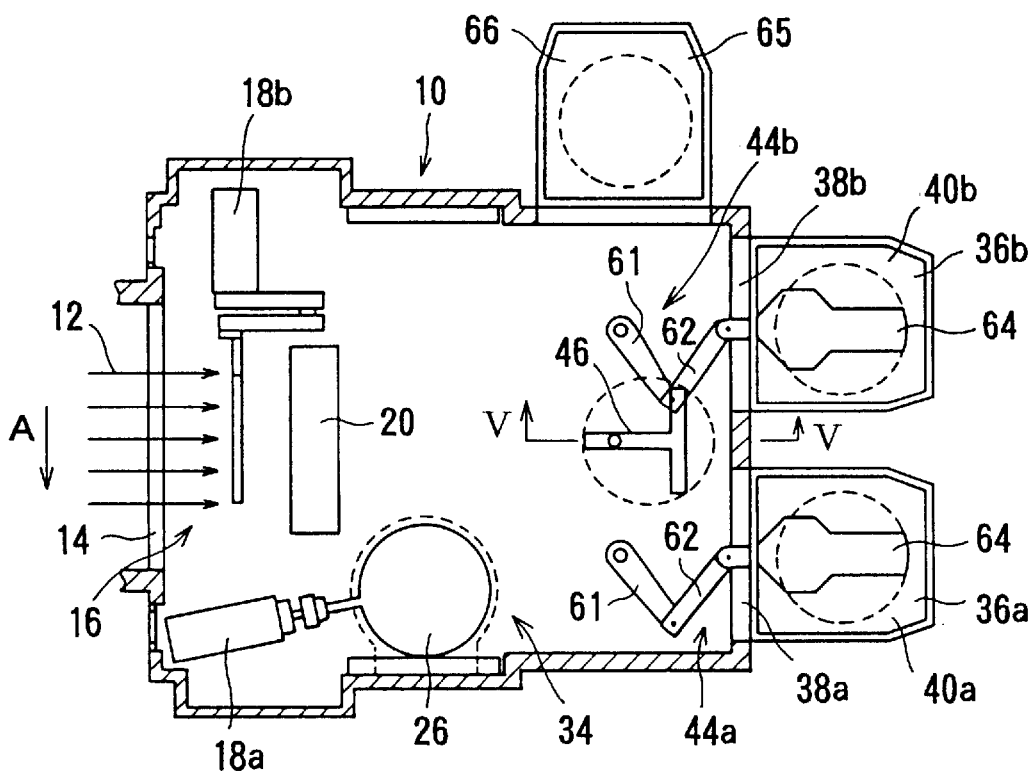
F I G. 1A
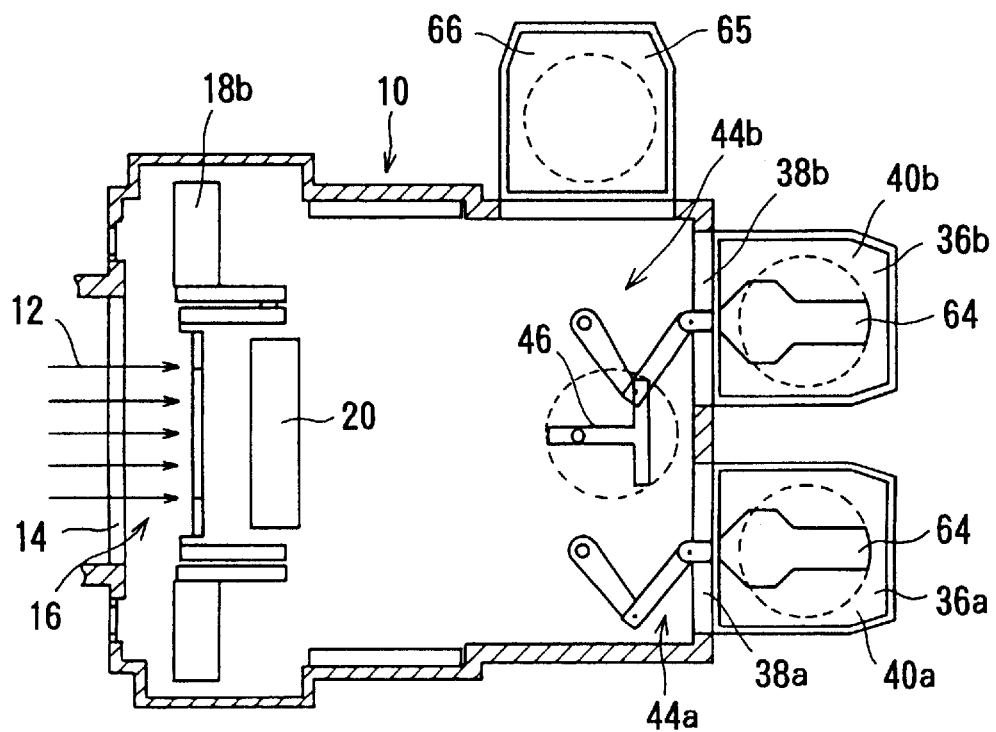
F I G. 1B

F I G. 2
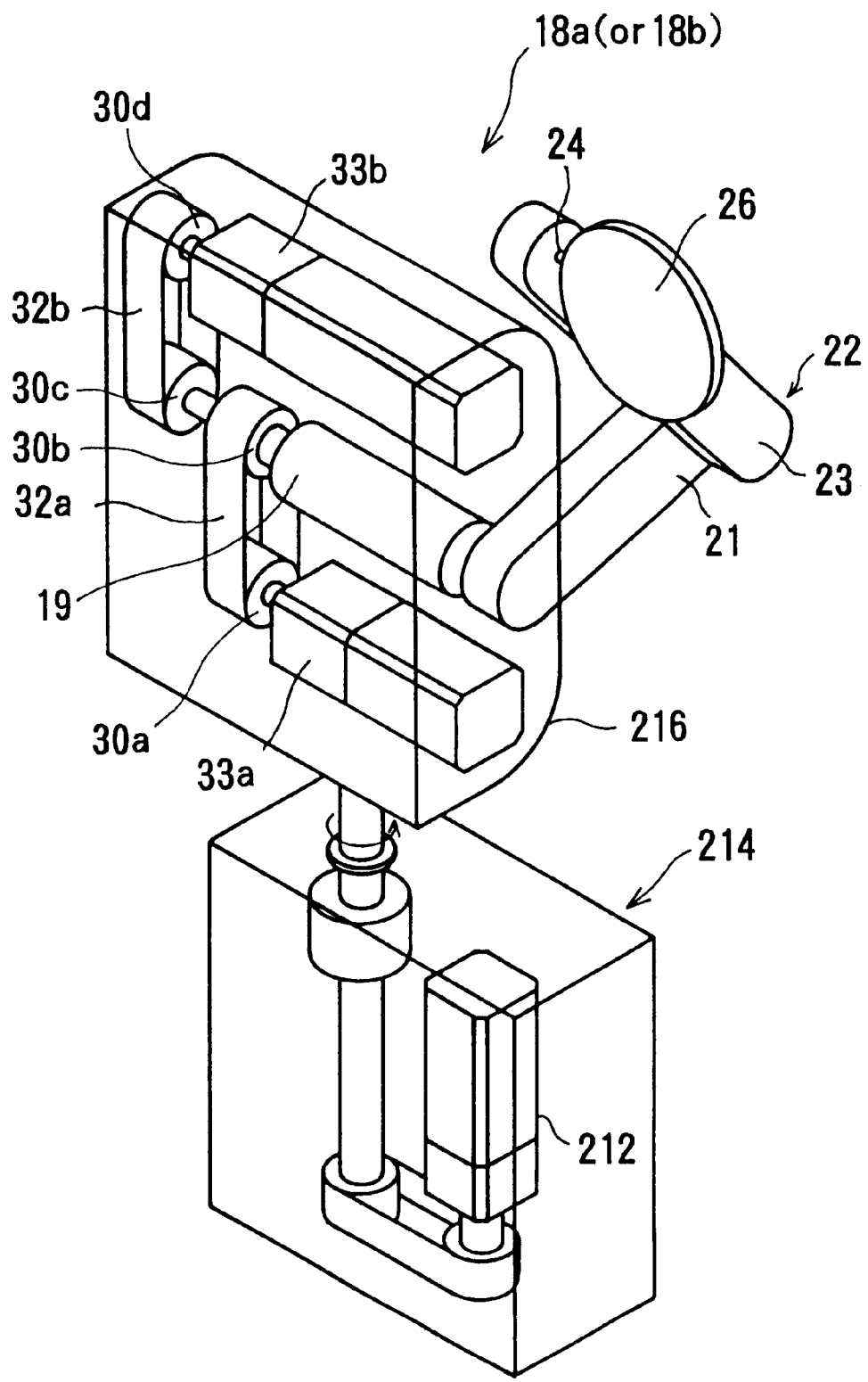

F I G. 1 4
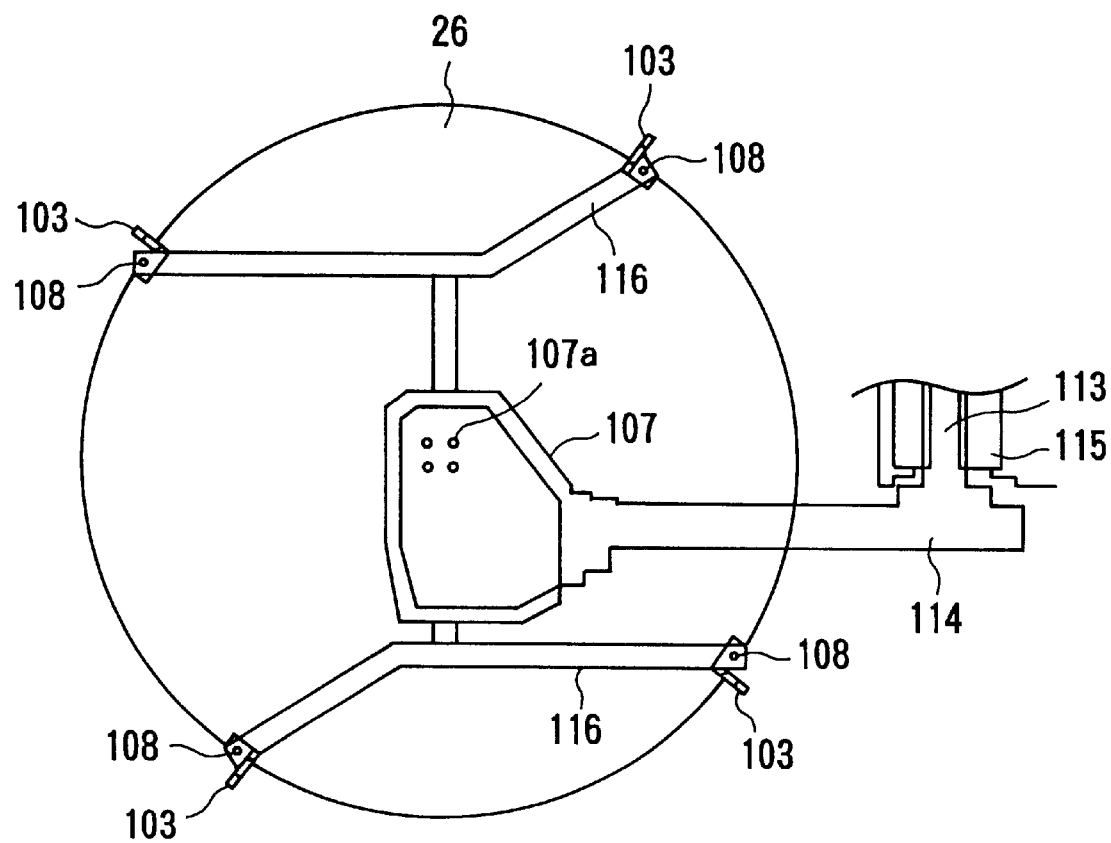

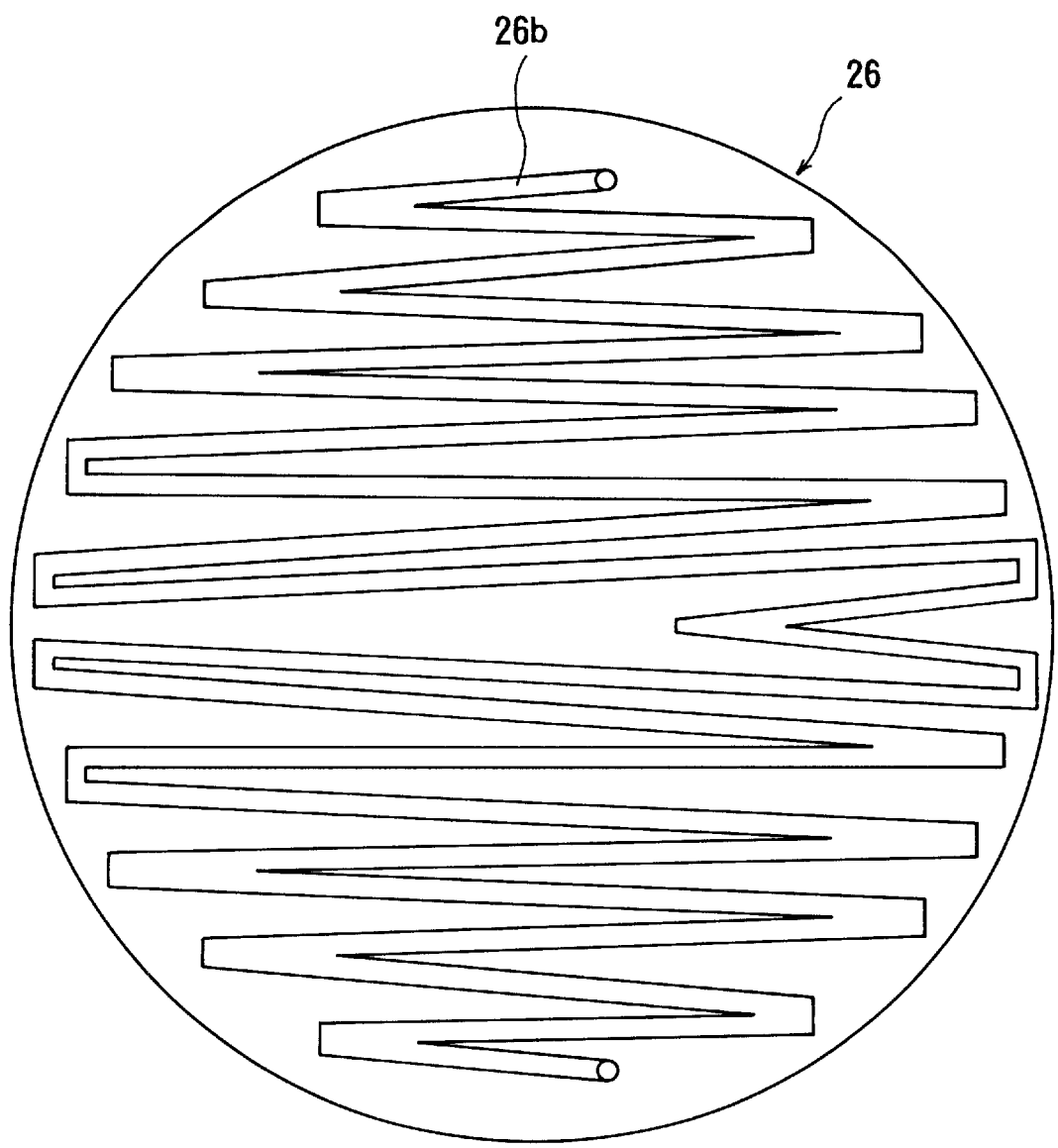
F I G. 18

SUBSTRATE HANDLING APPARATUS AND ION IMPLANTATION APPARATUS

BACKGROUND OF THE INVENTION

1. Field of the Invention

The present invention relates to a substrate handling apparatus for handling a substrate such as a semiconductor wafer and an ion implantation apparatus for implanting ions into the substrate.

2. Description of the Related Art

As semiconductor wafers to be processed have become larger in diameter, batch-processing ion implanters for simultaneously processing a plurality of semiconductor wafers are going to be replaced with single-substrate-processing ion implanters which process one semiconductor wafer at a time. As an example, the single-substrate-processing ion implanter has two multi-articulated robot arm assemblies (substrate holding robots or substrate holding devices) with respect to one ion beam source, for holding and sequentially exposing substrates such as semiconductor wafers to an ion beam. These articulated robot arm assemblies allow the ion implanters to operate efficiently. The articulated robot arm assembly, which can be extended and contracted, moves a substrate such as a semiconductor wafer in a direction perpendicular to the ion beam to allow the ion beam to be applied to the substrate in their entirety, and also replaces the substrate with a new substrate such as a semiconductor wafer.

The single-substrate-processing ion implanter also has two load-lock chambers for placing therein cassettes storing a plurality of substrates such as semiconductor wafers, positioned in confronting relation to the articulated robot arm assemblies, respectively. Feed robots for transferring substrates are disposed between the load-lock chambers and the articulated robot arm assemblies, thus constituting two parallel feed lines. Substrates such as semiconductor wafers are reciprocally transferred by the feed robots along the feed lines between the cassettes and the articulated robot arm assemblies (substrate holding devices).

In the above single-substrate-processing ion implantation, since the substrate holding devices and the cassettes are provided exclusively for respective groups of substrates such as semiconductor wafers, the movement of the substrates is limited, and cannot flexibly be adapted to various different operating conditions. For example, if two successive substrates are made defective by an ion implantation failure due to a malfunction of an ion source or the like, then the subsequent processing is tedious and time-consuming because the two defective substrates need to be returned to the respective cassettes. In some applications, buffer chambers are disposed alongside of a vacuum chamber for rearranging the inserted positions of substrates such as semiconductor wafers in the cassettes. Such buffer chambers make the ion implanter undesirably large in size because it has been customary to place the buffer chambers on both sides of the ion implanter.

It is desirable that each of the feed robots that are disposed between the load-lock chambers and the articulated robot arm assemblies has a clamp mechanism on its robot hand for reliably and quickly feeding a substrate such as a semiconductor wafer. One type of such a clamp mechanism comprises a vacuum suction mechanism. However, the vacuum suction mechanism cannot be used in a vacuum atmosphere, and tends to apply a large quantity of particles to a substrate as it contacts a wide area of the substrate. Another clamp mechanism for use on the robot hand has an actuator for opening and closing clamp fingers. The clamp mechanism with the actuator makes the robot hand complex in structure and heavy in weight, and hence makes the robot hand difficult to move quickly.

Further, each of the articulated robot arm assemblies (substrate holding robots) has a substrate holding mechanism which comprises a substrate holder base for holding a substrate, a clamp mechanism for mechanically retaining the substrate on the substrate holder base, a substrate attracting mechanism such as an electrostatic chuck for attracting the substrate under electrostatic forces (Coulomb forces), a substrate cooling mechanism for cooling the substrate, and a substrate attaching and removing mechanism including a clamp operating mechanism for operating the clamp mechanism. These mechanisms are mounted on the tip end of the articulated robot arm assembly. Inasmuch as these mechanisms are constructed of many parts that are mounted on the tip end of the articulated robot arm assembly, the articulated robot arm assembly is necessarily large in size and heavy in weight. As a consequence, the substrate holding robots have their main bodies, arm assemblies, and actuators thereof that are relatively large in size, and hence the processing chamber (ion implantation chamber) is also relatively large in size. The tendency toward larger-size substrate holding robots manifests itself as substrates such as semiconductor wafers to be handled have larger diameters.

The substrate holding robot holds a substrate such as a semiconductor wafer by mechanically pressing the outer circumferential edge of the substrate with the clamp mechanism. However, because the clamp mechanism cannot apply sufficiently strong forces to press the semiconductor wafer, it cannot bring the entire surface of the substrate into intimate contact with a thermally conductive medium such as rubber. Therefore, the substrate pressed by the clamp mechanism cannot sufficiently be cooled by the substrate cooling mechanism. This problem is serious with the single-substrate-processing ion implanters because the ion beam applied intensively to substrates one by one develops intensive heat on the respective substrates.

Each of the articulated robot arm assemblies comprises a plurality of arms coupled by joints and an arm actuating mechanism connected to a proximal end of the arms. The arms house therein a power transmitting mechanism which comprises shafts, pulleys and belts. The arms that are positioned in the vacuum chamber have their internal space open into the vacuum chamber, so that the internal space of the arms can be evacuated by an evacuating mechanism connected to the vacuum chamber. The joints by which the arms are coupled use magnetic fluid seals, and the arms are of a closed structure except for air ports with filters which are disposed on backsides of the arms. This structure serves to prevent particles produced by sliding surfaces of the arms from being scattered in the vacuum chamber.

The articulated robot arm assemblies are complex in structure construction because of the joints using the magnetic fluid seals and the filters provided on the arms, and hence cannot be serviced simply for maintenance. Furthermore, the closed structure of the articulated robot arm assemblies is not effective enough to prevent particles from being scattered in the vacuum chamber. In addition, particles that can be trapped by the filters are subject to a certain limitation on their diameters.

SUMMARY OF THE INVENTION

It is therefore an object of the present invention to provide a substrate handling apparatus and an ion implantation apparatus of compact structure which can select paths of movement of substrates for an increased throughput and flexible adaptation to changes in operating conditions.

Another object of the present invention is to provide a substrate handling apparatus and an ion implantation apparatus which include a feed robot having a simple structure capable of reliably clamping and releasing substrates for an increased feed speed.

Still another object of the present invention is to provide a substrate handling apparatus and an ion implantation apparatus which have a substrate holding mechanism that is small in size and light in weight, and has desired functions that conventional substrate holding mechanisms offer.

Still another object of the present invention is to provide a substrate handling apparatus and an ion implantation apparatus which are capable of reliably holding substrates having a large diameter and sufficiently cooling substrates that are heated when ions are introduced or implanted.

Yet still another object of the present invention is to provide a substrate handling apparatus and an ion implantation apparatus which have a substrate holding robot that is simple in structure and can easily be serviced for maintenance, and that is effective in preventing particles from being scattered from sliding surfaces of robot arms.

According to an aspect of the present invention, there is provided an ion implantation apparatus comprising: a vacuum chamber; a beam exposure region defined in an end of the vacuum chamber; a pair of substrate holding devices disposed one on each side of the beam exposure region, each for holding a substrate to allow the substrate to be exposed to a beam in the beam exposure region; a pair of substrate storage units disposed in an opposite end of the vacuum chamber in confrontation with the substrate holding devices, respectively; a pair of feed robots disposed between the substrate storage units and the substrate holding devices, respectively; and a relay table disposed between the feed robots, for relaying a substrate.

The above arrangement allows a substrate to be transferred in the intersecting manner between two parallel feed lines in the vacuum chamber. Therefore, a wide choice is available in patterns of movement of substrates, and a desirable pattern can be selected for an increased throughput, to meet a change in the operating conditions of the ion implanter, and to achieve an increased level of the quality of processed substrates.

The ion implanter may further comprise a buffer chamber disposed on one side of the vacuum chamber, for temporarily storing a substrate therein. The buffer chamber is to rearrange substrates, and has heretofore been associated with each feed line. According to the present invention, the buffer chamber may be disposed on one side of the vacuum chamber because substrates can be transferred between feed lines via the relay table.

According to another aspect of the present invention, there is provided an ion implantation apparatus comprising: a vacuum chamber having a substrate supply unit therein; a substrate feed robot disposed in the vacuum chamber, for taking a substrate into and out of the substrate supply unit; the substrate feed robot having an articulated arm assembly and a hand mounted on a distal end of the articulated arm assembly; the hand having a substrate support for supporting the substrate thereon, and a clamp mechanism for clamping the substrate supported on the substrate support under resilient forces; and unclamping members disposed in a loading position or an unloading position, for releasing the clamp mechanism.

Since the clamp mechanism is opened and closed with forces produced by the feed robot for actuating the hand, the hand itself does not have an actuator mechanism for unclamping the substrate carried thereby. Thus, the substrate can stably and quickly be fed by the hand which may be relatively simple in structure and light in weight.

The clamp mechanism may comprise a clamp lever mounted on a reverse side of the hand, a spring for normally biasing the clamp lever, a clamp pin projecting from a distal end of the camp lever through the hand to the substrate support, and a release member mounted on the clamp lever for engaging the unclamping members. Since sliding surfaces of the clamp mechanism are disposed on the reverse side of the hand, particles produced by the sliding surfaces of the clamp mechanism are prevented from being applied to the substrate which is being clamped by the clamp mechanism.

The substrate support may have a plurality of support pins for supporting a reverse side of the substrate on respective tip ends thereof. Any area of the substrate support which supports the substrate in contact therewith is thus minimized to prevent particles from being applied to the substrate which is being supported on the substrate support.

The substrate support may have a guide pin for guiding a side edge of the substrate. Consequently, any area of the substrate support which guides the substrate in contact therewith is minimized to prevent particles from being applied to the substrate which is being supported on the substrate support.

According to still another aspect of the present invention, there is provided an ion implantation apparatus comprising: a vacuum chamber; a beam exposure region defined in an end of the vacuum chamber; a substrate holding device disposed near the beam exposure region and having a substrate holding mechanism for holding a substrate while the substrate is being exposed to a beam in the beam exposure region, the substrate holding mechanism having a holder base for holding the substrate and a clamp mechanism for clamping the substrate on the holder base; and an attaching and removing device disposed in the vacuum chamber separately from the substrate holding device, the attaching and removing device including a clamp operating mechanism for placing the substrate on or removing the substrate from the substrate holding device when the substrate holding device receives or transfers the substrate in a predetermined position in the vacuum chamber.

Since the attaching and removing device is disposed in the vacuum chamber separately from the substrate holding device, the substrate holding device may be reduced in size and weight while performing desired functions that conventional substrate holding mechanisms have.

The attaching and removing device may include a retracting mechanism for retracting the attaching and removing device to a position near a wall surface of the vacuum chamber unless the substrate holding device receives or transfers the substrate in the predetermined position in the vacuum chamber. By utilizing a space in which the attaching and removing device can be retracted, the ion implanter may be made compact.

The ion implanter may comprise a pair of the substrate holding devices and a pair of the attaching and removing devices. Thus, the ion implanter may be compact and highly efficient for ion implantation.

According to yet another aspect of the present invention, there is provided an ion implantation apparatus comprising: a vacuum chamber; a beam exposure region defined in an end of the vacuum chamber; a substrate holding device disposed near the beam exposure region and having a substrate holding mechanism for holding a substrate while the substrate is being exposed to a beam in the beam exposure region, the substrate holding mechanism having a holder base for holding the substrate, a mechanical clamp for clamping the substrate on the holder base under mechanical forces, and an electrostatic chuck for retaining the substrate on the holder base under electrostatic forces; and an interlocking mechanism for interlocking the electrostatic chuck with the mechanical clamp in operation.

While ions are being implanted into the substrate, the substrate is securely held in position by the mechanical clamp and the electrostatic chuck.

According to yet still another aspect of the present invention, there is provided an ion implantation apparatus comprising: a vacuum chamber; a beam exposure region defined in an end of the vacuum chamber; and a substrate holding device disposed near the beam exposure region and having a substrate holding mechanism for holding a substrate while the substrate is being exposed to a beam in the beam exposure region, the substrate holding mechanism having a holder base for holding the substrate and a substrate cooling mechanism for supplying a gas between the holder base and the substrate to cool the substrate.

When the substrate cooling mechanism supplies a gas between the holder base and the substrate to cool the substrate, the gas forms a gas film filled between the holder base and the substrate, and the gas film serves as a thermally conductive medium to effectively cool the substrate which has been heated by implantation of ions into the substrate.

According to a further aspect of the present invention, there is provided an ion implantation apparatus comprising: a vacuum chamber; a beam exposure region defined in an end of the vacuum chamber; a substrate holding device disposed near the beam exposure region and having a substrate holding mechanism for holding a substrate while the substrate is being exposed to a beam in the beam exposure region, the substrate holding mechanism having a holder base for holding the substrate, a mechanical clamp for clamping the substrate on the holder base under mechanical forces, an electrostatic chuck for retaining the substrate on the holder base under electrostatic forces, and a substrate cooling mechanism for supplying a gas between the holder base and the substrate to cool the substrate; an interlocking mechanism for interlocking the electrostatic chuck with the mechanical clamp in operation; and a gas control mechanism for starting or stopping supplying the gas between the holder base and the substrate when the substrate is placed on or removed from the holder base.

When the substrate is placed on or removed from the holder base by the mechanical clamp and the electrostatic chuck, the gas simultaneously starts or stops being supplied to the gap between the holder base and the substrate. Therefore, the placing of the substrate on the holder base or the removal of the substrate from the holder base is performed simultaneously with the starting or stopping of the supply of the gas to the gap between the holder base and the substrate.

According to a still further aspect of the present invention, there is provided an ion implantation apparatus comprising: a vacuum chamber; a beam exposure region defined in an end of the vacuum chamber; a substrate holding robot disposed near the beam exposure region, for holding a substrate while the substrate is being exposed to a beam in the beam exposure region; the substrate holding robot comprising two hollow arms joined to each other by a joint, a bearing and a power transmitting mechanism housed in the arms, and an evacuating passage defined in the arms for evacuating the arms to attract particles produced by the bearing or the power transmitting mechanism.

Therefore, particles that are produced by the shafts and the power transmitting mechanism in the arms can be attracted and removed via the evacuating passage, which is separate from the space in the vacuum chamber, without contaminating the space in the vacuum chamber.

The joint may have a hollow shaft communicating between spaces in the two hollow arms. The hollow shaft allows the hollow arms to communicate with each other in a simpler structure than would be if the hollow arms communicate with each other via a tube. Since no tube is used to provide communication between the hollow arms, no tube would interfere with motion of the substrate holding robot and movement of the substrate in the vacuum chamber.

The above and other objects, features, and advantages of the present invention will become apparent from the following description when taken in conjunction with the accompanying drawings which illustrate preferred embodiments of the present invention by way of examples.

BRIEF DESCRIPTION OF THE DRAWINGS

FIGS. 1A and 1B are sectional plan views of an ion implanter (ion implantation apparatus) according to the present invention;

FIG. 2 is a perspective view of a substrate holding robot of the ion implanter shown in FIGS. 1A and 1B;

FIG. 14 is a plan view of the substrate holder base;

FIG. 18 is a plan view of a coolant passage in a substrate holding surface of the substrate holder base;

DETAILED DESCRIPTION OF THE PREFERRED EMBODIMENT

Figure 3:
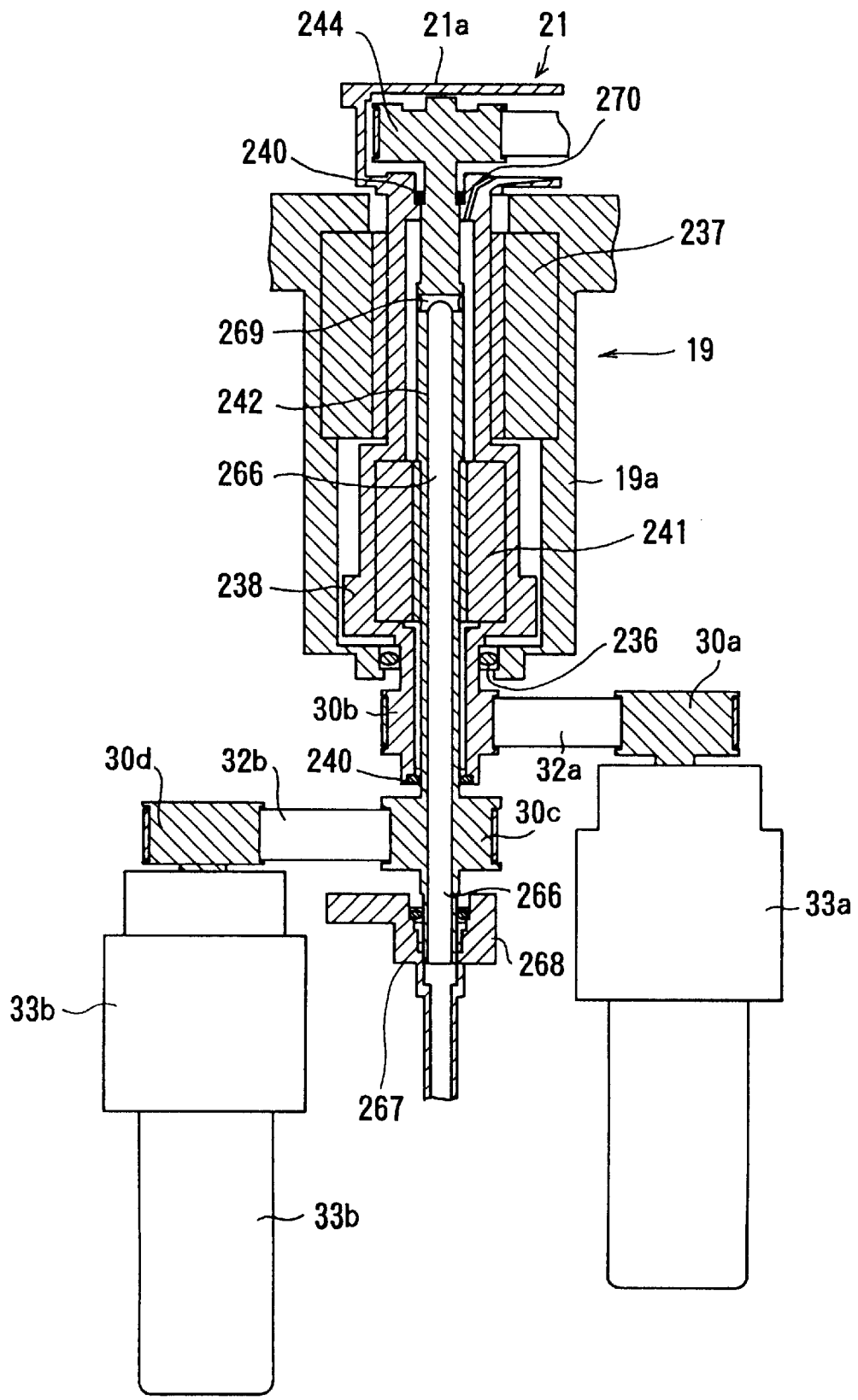
FIG. 3 is a vertical cross-sectional view of the substrate holding robot shown in FIG. 2, showing a structure of a base arm.

As shown in FIGS. 1A and 1B, an ion implanter (ion implantation apparatus) according to the present invention includes a vacuum chamber 10 having a generally rectangular bottom. An ion beam source (not shown) for emitting an ion beam 12 of circular cross section while horizontally scanning the ion beam 12 is positioned on the left-hand side of the vacuum chamber 10. A beam window 14 is defined in a left-hand side wall of the vacuum chamber 10, and a beam exposure region 16 is positioned inwardly of the beam window 14 for exposing a substrate comprising a semiconductor wafer W to the ion beam 12 that has passed through the beam window 14. The vacuum chamber 10 houses a pair of substrate holding robots 18a, 18b disposed one on each side of the beam exposure region 16. An ion current detector 20 is disposed behind the beam exposure region 16 for measuring an intensity of the ion beam 12 that has passed through the beam exposure region 16 without hitting a semiconductor wafer W.

The substrate holding robots 18a, 18b serve as a substrate holding device, and each of the substrate holding robots 18a, 18b is in the form of a rotatable articulated robot, as shown in FIG. 2. Specifically, each of the substrate holding robots 18a, 18b comprises a movable housing 216 rotatable in a horizontal plane by a horizontal rotating mechanism 214 having a motor 212, a base arm 19 horizontally supported in the movable housing 216, a first movable arm 21 mounted on a distal end of the base arm 19 for angular movement in a vertical plane, and a second movable arm 23 mounted on a distal end of the first movable arm 21 by a joint 22 for angular movement in a vertical plane.

A rotatable attachment shaft 24 is mounted on a distal end of the second movable arm 23 and extends in a direction perpendicular to the vertical plane in which the second movable arm 23 is angularly movable. The rotatable attachment shaft 24 supports a substrate holder base 26 on its distal end. The movable housing 216 accommodates therein first and second actuator mechanisms (motors) 33a, 33b for actuating the first and second movable arms 21, 23 and the rotatable attachment shaft 24 via pulleys 30a, 30b, 30c, 30d and belts 32a, 32b.

The base arm 19 and the first and second movable arms 21, 23 will be described in detail below with reference to FIGS. 3 and 4.

As shown in FIG. 3, the base arm 19 comprises an outer shaft 238 rotatably supported by a bearing 236 and a magnetic fluid seal 237 in a base arm casing 19a that is fixed to the movable housing 216, and an inner shaft 242 rotatably supported by bearings 240 and a magnetic fluid seal 241 in the outer shaft 238. The magnetic fluid seals 237, 241 hermetically isolate the interior from the exterior. The outer shaft 238 has a distal end which integrally forms an arm casing 21a of the first movable arm 21 and a proximal end which is coupled to an output shaft of the first motor 33a through the pulleys 30b, 30a and the belt 32a. The inner shaft 242 has a distal end projecting into the arm casing 21a of the first movable arm 21 and having an integral pulley 244, and a proximal end coupled to an output shaft of the second motor 33b through the pulleys 30c, 30d and the belt 32b.

Figure 4:
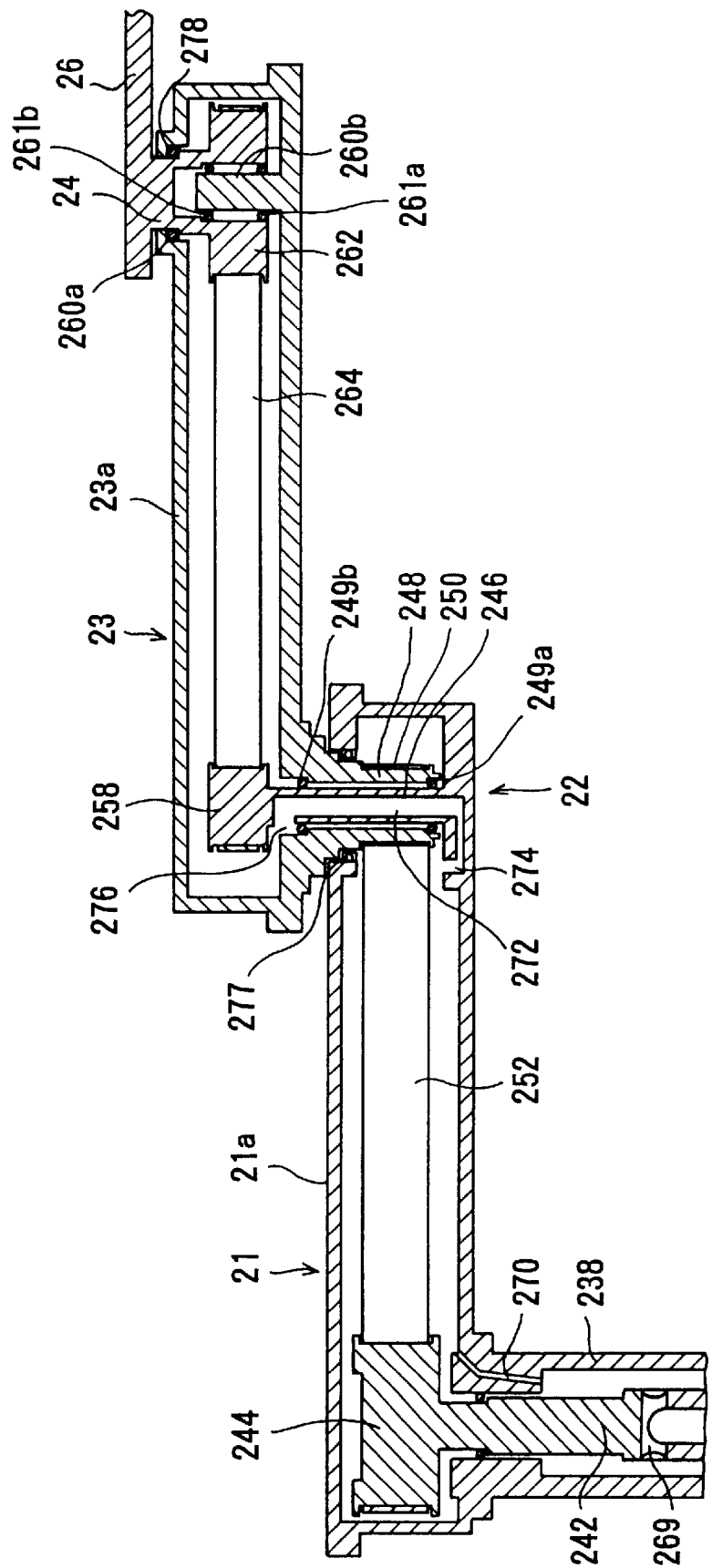
FIG. 4 is a vertical cross-sectional view of the substrate holding robot shown in FIG. 2, showing a structure of movable arms.

As shown in FIG. 4, the arm casing 21a of the first movable arm 21 has an inner joint shaft 246 at a distal end thereof. A hollow outer joint shaft 248 which projects from a proximal end of an arm casing 23a of the second movable arm 23 is provided outwardly of the inner joint shaft 246. The outer joint shaft 248 is rotatably supported on the inner joint shaft 246 by upper and lower bearings 249a, 249b. The outer joint shaft 248 has a pulley 250 disposed in the first arm casing 21a. The inner shaft 242 has a pulley 244 on the distal end thereof. A timing belt 252 is trained around the pulley 250 and the pulley 244.

The inner joint shaft 246 has a distal end extending into the arm casing 23a and having a pulley 258 disposed in the arm casing 23a. The arm casing 23a has an inner shaft 260b disposed in a distal end thereof. The rotatable attachment shaft 24 is rotatably supported on the inner shaft 260b by bearings 261a, 261b. The rotatable attachment shaft 24 has a pulley 262 disposed in the arm casing 23a. A timing belt 264 is trained around the pulley 262 and the pulley 258 on the inner joint shaft 246.

When the inner shaft 242 and the outer shaft 238 are rotated simultaneously, the first and second movable arms 21, 23 and the substrate holder base 26 are angularly moved in unison with each other without causing a change in their relative position. When the inner shaft 242 is fixed against rotation and the outer shaft 238 is rotated, the first and second movable arms 21, 23 change the included angle therebetween, but the substrate holder base 26 has its substrate holding surface oriented in the same direction because the rotatable attachment shaft 24 is angularly moved depending on the included angle between the first and second movable arms 21, 23. Therefore, the substrate holder base 26 is translated in the vertical plane.

The substrate holding robots 18a, 18b have evacuating passages for evacuating the interior spaces of the arms 19, 21, 23 for thereby preventing particles produced by sliding surfaces in the substrate holding robots 18a, 18b from being scattered out of the substrate holding robots 18a, 18b. Specifically, the inner shaft 242 has a space 266 (see FIG. 3) defined therein and having an open distal end which is connected to an evacuating device through a gas passage connector 268. The junction between the gas passage connector 268 and the inner shaft 242 is sealed by a seal ring 267. The space 266 in the inner shaft 242 is connected to a space in the outer shaft 238 through an opening 269 defined in the inner shaft 242 near its distal end. The space in the outer shaft 238 is connected to the interior space of the first movable arm 21 by a communication hole 270 which is defined in the end of the outer shaft 238 which is connected to the first movable arm 21.

The inner joint shaft 246 in the joint 22 has a space 272 (see FIG. 4) defined axially therein which is connected to the interior spaces of the first and second movable arms 21, 23 by respective communication holes 274, 276 defined in respective axial ends of the inner joint shaft 246. Sliding surfaces of the arm casing 21a and the outer joint shaft 248 are hermetically sealed by a seal ring 277. Sliding surfaces of the arm casing 23a and the attachment shaft 24 are hermetically sealed by a seal ring 278.

With the structure shown in FIGS. 2 through 4, since the interior spaces of the base arm 19 and the first and second arms 21, 23 can be evacuated, particles produced by the sliding surfaces in the substrate holding robots 18a, 18b, each in the form of a rotatable articulated robot, are attracted into the evacuating passages and prevented from being scattered into the vacuum chamber 10. Accordingly, the ion implanter according to the present invention can manufacture high-quality semiconductor wafers which are not contaminated by particles.

Furthermore, since particles produced by the sliding surfaces are attracted respectively from the sliding surfaces, it is not necessary for the joint 22 to have magnetic fluid seals and for the arms 19, 21, 23 to have filters. Therefore, the substrate holding robots 18a, 18b are relatively simple in structure and can easily be serviced for maintenance.

The substrate holder base 26 shown in FIG. 2 has an electrostatic chuck for attracting a semiconductor wafer W under electrostatic forces and a mechanical chuck operated with the electrostatic chuck. The substrate holder base 26 also has a substrate cooling mechanism for cooling the substrate holder base 26 to cool the semiconductor wafer W which generates heat when ion is implanted and a mechanism for passing a gas to promote thermal conduction between the substrate holder base 26 and the semiconductor wafer W, as described later on.

The vacuum chamber 10 shown in FIGS. 1A and 1B has a mechanism for releasing the electrostatic chuck and the mechanical chuck, and an ejector pin device for ejecting the semiconductor wafer W as the substrate holder base 26 is lowered, all at a substrate transfer position 34 to which the substrate holder base 26 is moved when each of the substrate holding robots 18a, 18b is turned backward.

As shown in FIGS. 1A and 1B, a pair of load-lock chambers 36a, 36b is mounted on a wall of the vacuum chamber 10 which confronts the beam window 14. The load-lock chambers 36a, 36b are substantially positioned in alignment with the respective substrate holding robots 18a, 18b. Gate valves 38a, 38b are interposed between the respective load-lock chambers 36a, 36b and the vacuum chamber 10. Cassettes 40a, 40b each having a plurality of shelves are vertically movably disposed in the respective load-lock chambers 36a, 36b. Articulated robot arms, i.e., feed robots, 44a, 44b each having a taking-out hand 64 on its distal end are disposed in front of the respective load-lock chambers 36a, 36b. The feed robots 44a, 44b serve to transfer semiconductor wafers W between the substrate holder bases 26 in the substrate transfer positions 34 and the cassettes 40a, 40b in the respective load-lock chambers 36a, 36b.

Figure 5:
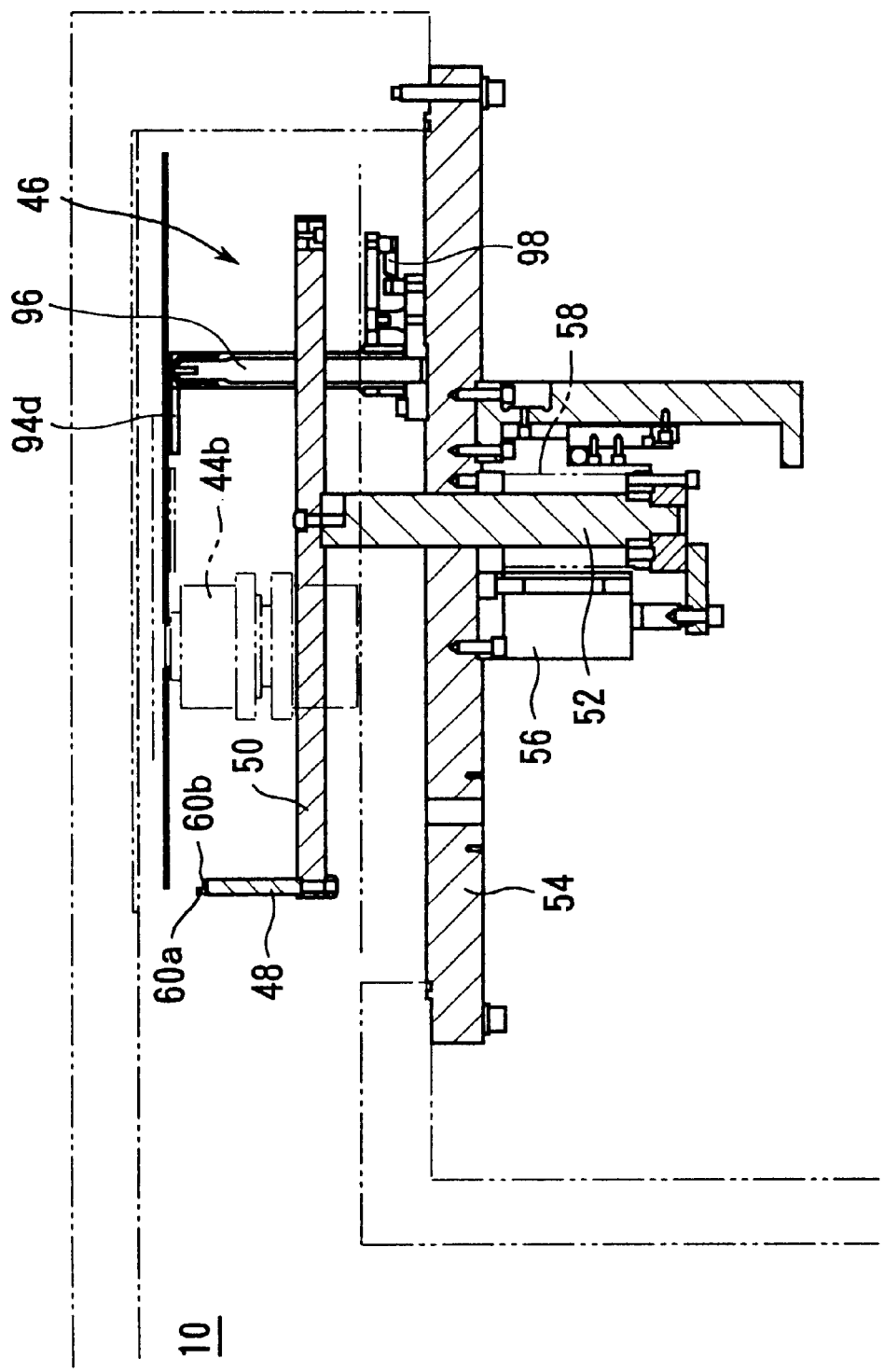
FIG. 5 is a cross-sectional view taken along line V—V of FIG. 1A.

A relay table 46 for relaying a semiconductor wafer W between the feed robots 44a, 44b is disposed between the feed robots 44a, 44b. As shown in FIG. 5, the relay table 46 comprises a base body 50 having vertical holder rods 48 for holding the semiconductor wafer W and a column 52 extending downwardly from a central region of the base body 50. The column 52 extends through a through hole defined in a bottom wall 54 of the vacuum chamber 10, and is connected to the output shaft of an air cylinder 56 fixedly mounted on a lower surface of the bottom wall 54. The portion of the column 52 between its lower end and the through hole defined in the bottom wall 54 is covered with a bellows 58 to keep the vacuum chamber 10 hermetically sealed.

A support pin 60a of synthetic resin for guiding a circumferential edge of the semiconductor wafer W and a pin 60b of sapphire for contacting a circumferential margin of the lower surface of the semiconductor wafer W are mounted on the upper tip end of each of the holder rods 48. A spring (not shown) is connected between the column 52 and the bottom wall 54 for adjusting the moving speed of the column 52. In a region of the vacuum chamber 10 where the feed robots 44a, 44b are located, i.e., in a substrate feed region, the bottom wall 54 is raised to provide a vertically smaller space in the vacuum chamber 10. In this manner, an unnecessary vacuum space is eliminated from the vacuum chamber 10 for effective space utilization around the vacuum chamber 10.

A buffer chamber 65 is mounted on a side wall of the vacuum chamber 10 in facing relation to the feed robot 44b. The buffer chamber 65 houses a buffer cassette 66 which is vertically movable therein, the buffer cassette 66 having a plurality of shelves for temporarily storing processed semiconductor wafers W, as described later on.

Figure 6A:
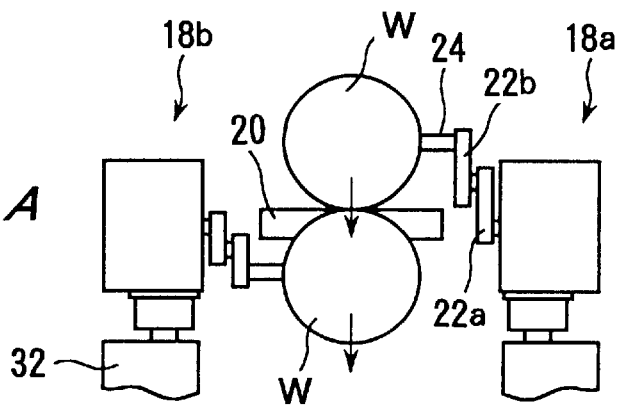
FIGS. 6A through 6D are views showing an ion implantation process.
Figure 6B:
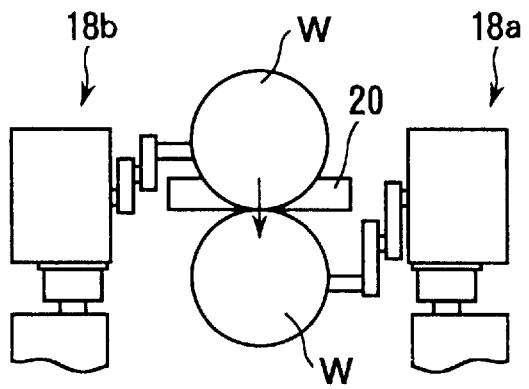
Figure 6C:
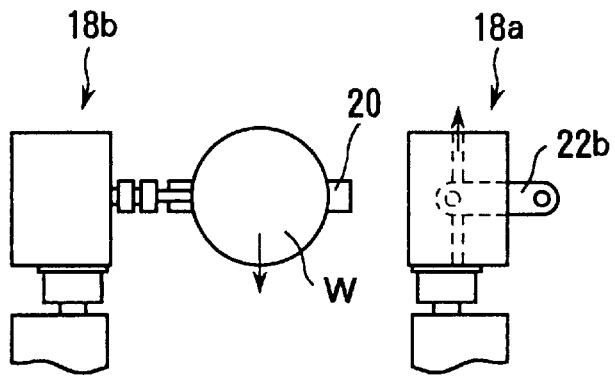
Figure 6D:
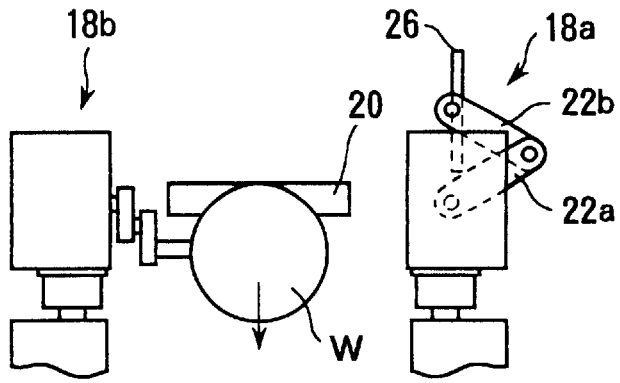

Operation of the ion implanter having the above structure will be described below. The ion beam source scans the ion beam 12 of circular cross section horizontally in the direction indicated by the arrow A in FIG. 1A. The feed robots 44a, 44b take out semiconductor wafers W from the cassettes 40a, 40b in the load-lock chambers 36a, 36b, and transfer the semiconductor wafers W to the wafer holder robots 18a, 18b which have been waiting in the respective substrate transfer positions 34. Each of the wafer holder robots 18a, 18b rotates the attachment shaft 24 to keep the substrate holding surface of the substrate holder base 26 vertically, and is horizontally rotated by the horizontal rotating mechanism 214 to carry the semiconductor wafer W to the beam exposure region 16 as shown in FIGS. 1B and 6A. The first and second actuator mechanisms 33a, 33b are operated to vertically move the semiconductor wafers W held by the wafer holder robots 18a, 18b and also to repeat such vertical movement, if necessary, as shown in FIGS. 6A through 6D, for allowing the semiconductor wafers W to be exposed to the ion beam 12.

Movement of semiconductor wafers W in the ion implanter will be described below. Paired components will be denoted such that the left-hand component of each pair, as viewed toward the ion beam source, is referred to as a first component and the right-hand component of each pair, as viewed toward the ion beam source, is referred to as a second component. In the ion implanter, semiconductor wafers W can be moved across the relay table 46 between two parallel wafer feed lines. Therefore, the ion implanter can process not only semiconductor wafers W fed from the respective cassettes 40a, 40b along the respective wafer feed lines, but also semiconductor wafers W fed successively from one of the cassettes 40a, 40b, for example. A processing sequence for processing semiconductor wafers W fed successively from one of the cassettes 40a, 40b will be described below with reference to FIGS. 7A through 7E.

Figure 7A:
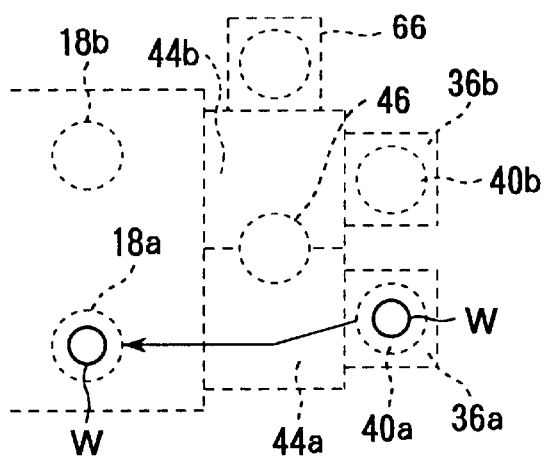
FIGS. 7A through 7E are views showing the manner in which substrates (semiconductor wafers) move.
Figure 7D:
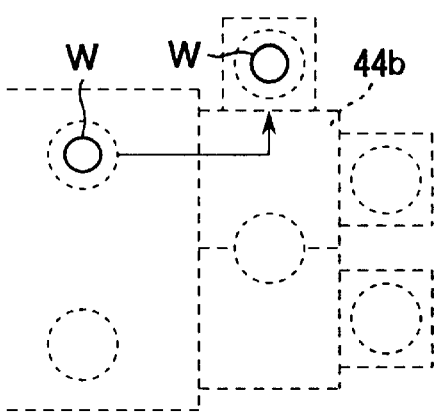
Figure 7B:
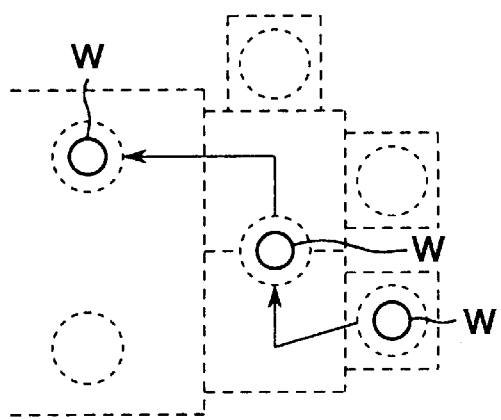
Figure 7E:
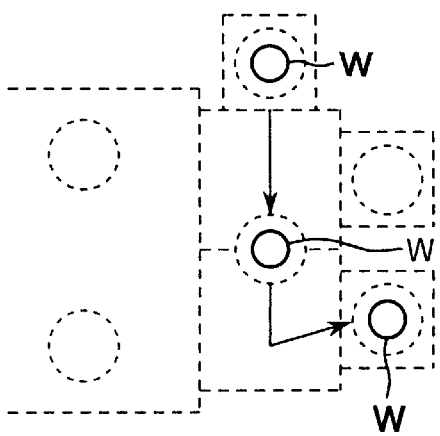
Figure 7C:
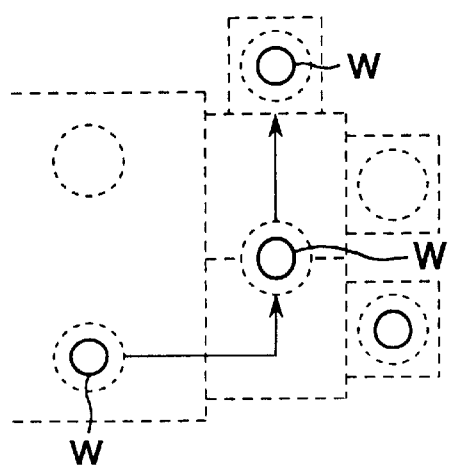

First, the first feed robot 44a takes out a semiconductor wafer W from the lowermost shelf of the first cassette 40a, and transfers the semiconductor wafer W to the first substrate holding robot 18a, as shown in FIG. 7A. The first substrate holding robot 18a carries the semiconductor wafer W to the beam exposure position 16, and lowers or turns the semiconductor wafer W to allow the semiconductor wafer W to be implanted with ions while it is being exposed to the ion beam 12. Then, the first feed robot 44a takes out another semiconductor wafer W from a second shelf, located at the secondary lowermost shelf, of the first cassette 40a, and places the semiconductor wafer W on the relay table 46 as shown in FIG. 7B. The second feed robot 44b then transfers the semiconductor wafer W from the relay table 46 to the second substrate holding robot 18b, which lowers or turns the semiconductor wafer W to allow the semiconductor wafer W to be implanted with ions while it is being exposed to the ion beam 12. As shown in FIG. 7C, the processed semiconductor wafer W which is held by the first substrate holding robot 18a is placed on the relay table 46 by the first feed robot 44a, and then placed into an uppermost shelf in the buffer cassette 66 in the buffer chamber 65 by the second feed robot 44b. The processed semiconductor wafer W which is held by the second substrate holding robot 18b is placed into a second shelf, located at the secondary uppermost shelf, in the buffer cassette 66 directly by the second substrate holding robot 18b, as shown in FIG. 7D.

Figure 8:
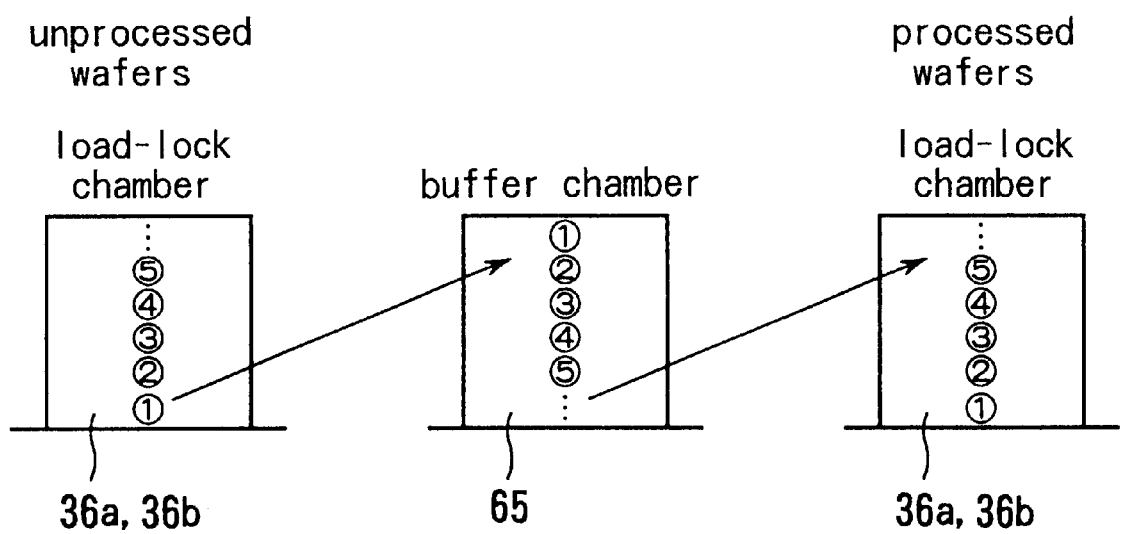
FIG. 8 is a diagram showing the manner in which substrates (semiconductor wafers) move.

The operations shown in FIGS. 7A through 7D are repeated to introduce ions into unprocessed semiconductor wafers W from the load-lock chamber 36a. The processed semiconductor wafers W are stored in a vertically reversed order into the buffer cassette 66, as shown in FIG. 8. After all semiconductor wafers W in the cassette 40a have been processed, the processed semiconductor wafers W are returned from the buffer cassette 66 to the empty cassette 40a in the first load-lock chamber 36a. Specifically, as shown in FIGS. 7E and 8, the second feed robot 44b takes out the semiconductor wafers W successively upwardly from the shelves in the buffer cassette 66, and places the semiconductor wafers W successively onto the relay table 46. Then, the first feed robot 44a transfers the semiconductor wafers W successively from the relay table 46, and stores the semiconductor wafers W successively downwardly into the shelves in the first cassette 40a.

In this manner, the processed semiconductor wafers W are put in a downward order into the first cassette 40a and stored in the original order into the first cassette 40a. Consequently, particles produced when a processed semiconductor wafer W is placed on a shelf in the first cassette 40a are prevented from dropping onto and contaminating a processed semiconductor wafer W which has been placed in a lower shelf in the first cassette 40a. Because semiconductor wafers W can thus be transferred across the relay table 46 between the first feed line and the buffer chamber 65, it is not necessary to provide two buffer chambers 65 one on each side of the feed lines, and hence the ion implanter may be made relatively compact.

Figure 9A:
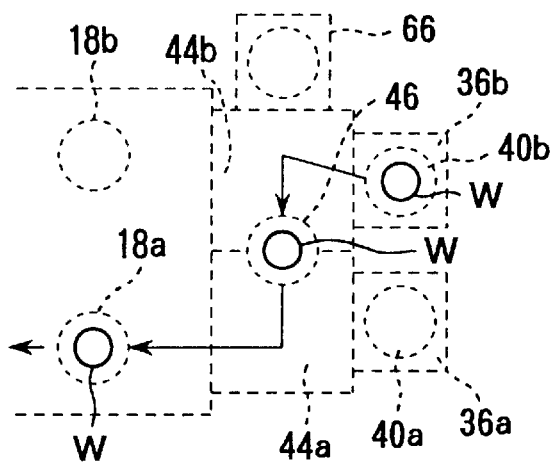
FIGS. 9A through 9E are views showing the manner in which substrates (semiconductor wafers) move.
Figure 9D:
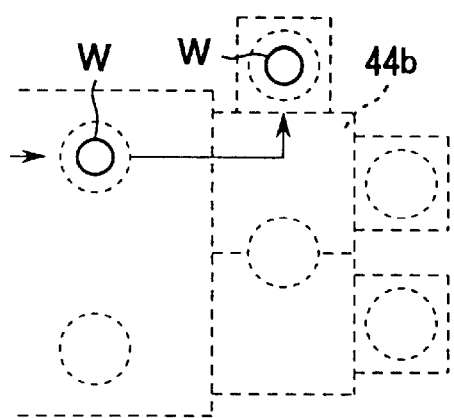
Figure 9B:
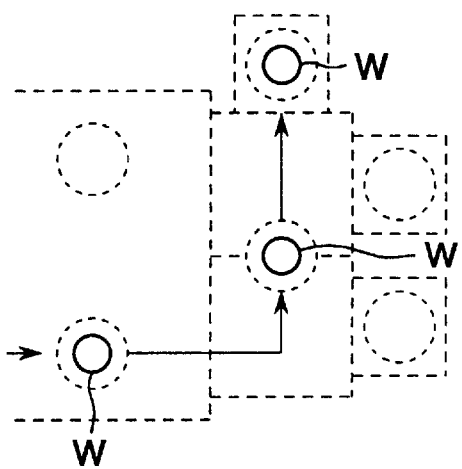
Figure 9E:
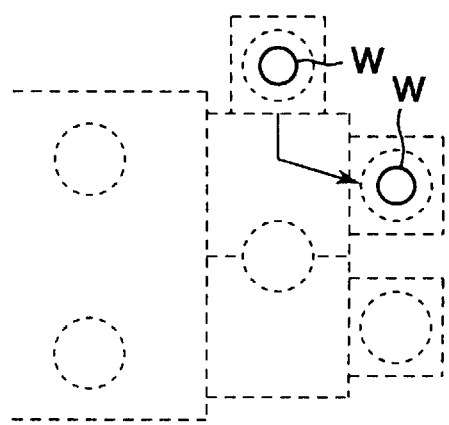
Figure 9C:
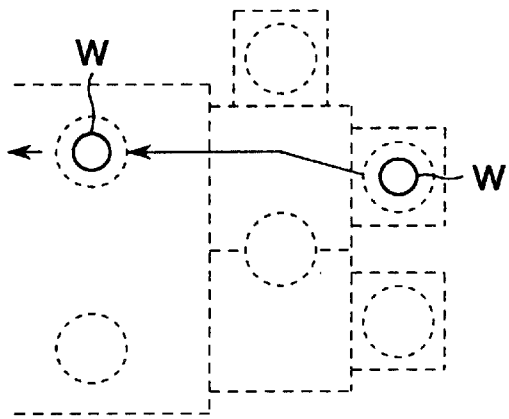

FIGS. 9A through 9E show a processing sequence for processing semiconductor wafers W supplied from the second load-lock chamber 36b and returning the processed semiconductor wafers W to the second load-lock chamber 36b. The steps shown in FIGS. 9A through 9D are basically the same as those shown in FIGS. 7A through 7D. The processed semiconductor wafers W are returned from the buffer cassette 66 directly to the second load-lock chamber 36b without going through the relay table 46, as shown in FIG. 9E. Therefore, the processing sequence shown in FIGS. 9A through 9E is shorter than the processing sequence shown in FIGS. 7A through 7E. In the processing sequence shown in FIGS. 7A through 7E, the step shown in FIG. 9E may be carried out in such a condition that an empty cassette is installed in the second load-lock chamber 36b. In this modification, while the processed semiconductor wafers W are being returned from the buffer cassette 66 directly to the second load-lock chamber 36b, the processing sequence shown in FIGS. 7A through 7D may concurrently be performed on unprocessed semiconductor wafers W that are supplied from a new first cassette 40a which has replaced the empty cassette 40a in the first load-lock chamber 36a.

Furthermore, as with the conventional single-substrate-processing ion implanters, semiconductor wafers W in the first load-lock chamber 36a and semiconductor wafers W in the second load-lock chamber 36b may be supplied successively along their respective feed lines to the first and second substrate holding robots 18a, 18b. In this modification, processed semiconductor wafers W may be placed via the relay table 46 into the buffer chamber 65, so that the unprocessed semiconductor wafers w may be taken out successively upwardly from the cassettes 40a, 40b and the processed semiconductor wafers W may be returned successively downwardly to the cassettes 40a, 40b.

A certain pattern in which semiconductor wafers W are moved via the relay table 46 has been described above. However, semiconductor wafers W may be moved in any of various other patterns. Such patterns of movement of semiconductor wafers W may be changed depending on design changes of the ion implanter or changes in environmental conditions thereof. Therefore, the ion implanter according to the present invention can flexibly be adapted to various changes in operating conditions thereof.

As described above, according to the embodiment shown in FIGS. 1 through 9, semiconductor wafers W can be moved across the relay table 46 between two parallel wafer feed lines. Inasmuch as a wide choice is available in patterns of movement of semiconductor wafers W, a desirable pattern can be selected for an increased throughput or to meet a change in the operating conditions of the ion implanter.

Figure 10:
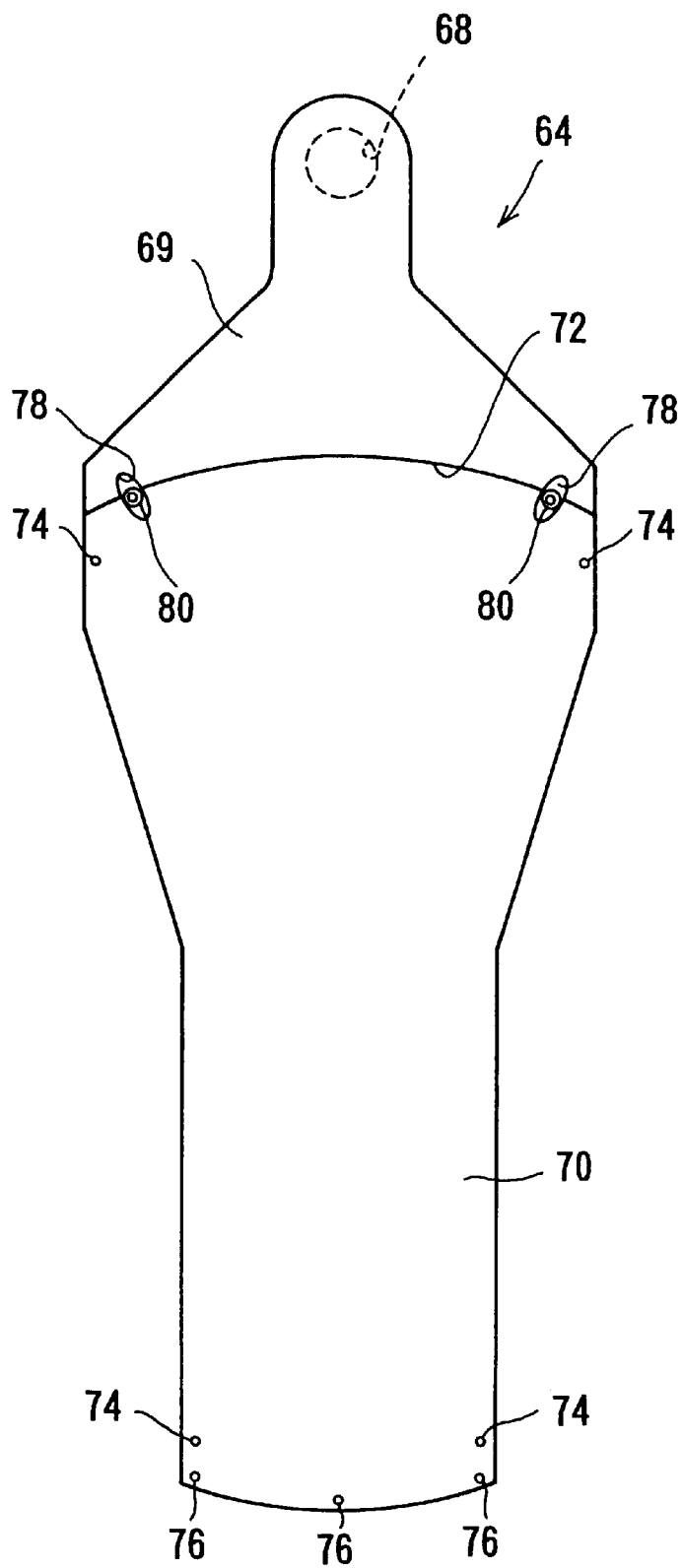
FIG. 10 is a plan view of the hand of a feed robot of the ion implanter shown in FIGS. 1A and 1B.

Each of the feed robots 44a, 44b shown in FIGS. 1A and 1B will be described in detail with reference to FIGS. 10 through 12. Each of the feed robots 44a, 44b comprises two arms 61, 62 (see FIG. 1A) connected to each other by a joint for angular movement in a horizontal plane, and a hand 64 mounted on a distal end of the arm 62 and swingable in a horizontal plane. As shown in FIG. 10, the hand 64 is of a substantially rectangular shape in its entirety, and includes a thick proximal end portion 69 having an attachment hole 68 defined therein for allowing the hand 64 to be attached to the arm 62. The hand 64 also includes a thin wafer support arm 70 at a forward portion which is divided from the thick proximal end portion 69 by an arcuate boundary edge 72. The wafer support arm 70 has a plurality of support pins 74 disposed on respective four corners thereof for contacting the lower surface of a semiconductor wafer W and supporting the semiconductor wafer W on respective tip ends thereof. The wafer support arm 70 also has a plurality of guide pins 76 positioned more closely to the distal end thereof than the support pins 74. The guide pins 76 project from an upper support surface of the wafer support arm 70 in such a state that the projecting length of each guide pin 76 is greater than the projecting length of each support pin 74. The guide pins 76 serve to contact an edge of the semiconductor wafer W to position the semiconductor wafer W on the wafer support arm 70.

Figure 11:
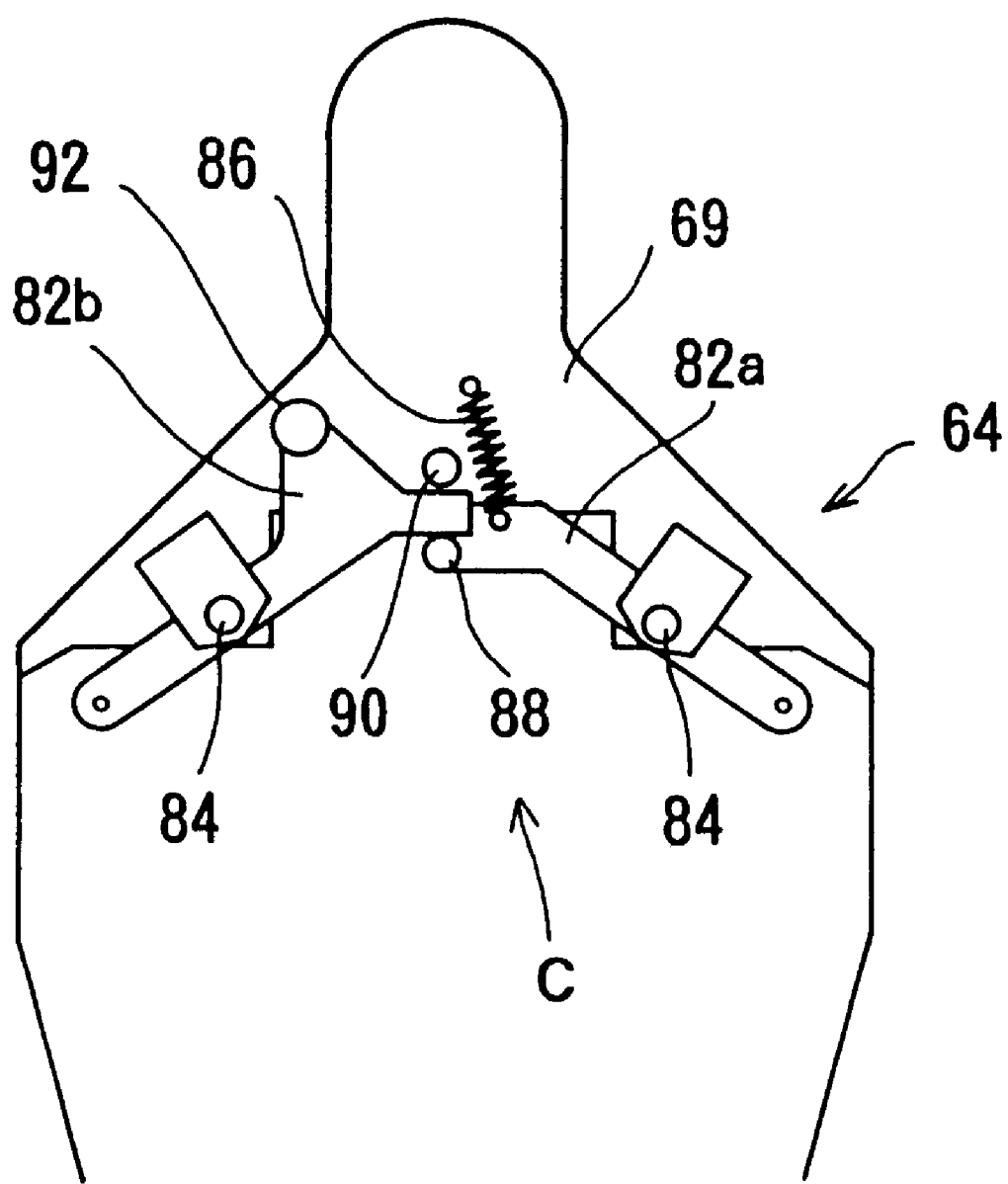
FIG. 11 is a plan view of a clamp mechanism mounted on a lower surface of the hand of the feed robot.

As shown in FIG. 11, the hand 64 has a clamp mechanism C. Specifically, the hand 64 has two oblong holes 78 (see FIG. 10) defined therein across the boundary edge 72, and two clamp pins 80 mounted respectively in the oblong holes 78 for movement therealong. The clamp pins 80 are connected respectively to outer ends of first and second clamp levers 82a, 82b which are mounted on a lower surface of the hand 64. The first and second clamp levers 82a, 82b are supported for angular movement in a horizontal plane by respective pivot shafts 84 mounted on the hand 64 and connected to central regions of the first and second clamp levers 82a, 82b.

The first clamp lever 82a, which is shown on a right-hand side in FIG. 11, has an inner end that is normally biased toward the proximal end of the hand 64 by a spring 86 connected between the inner end of the first clamp lever 82a and the thick proximal end portion 69 of the hand 64. The first clamp lever 82a has an engaging pin 88 mounted on the inner end thereof 1and held in engagement with an inner end of the second clamp lever 82b for pushing the second clamp lever 82b toward the proximal end of the hand 64. Since the inner ends of the first and second clamp levers 82a, 82b are urged together to move toward the proximal end of the hand 64 by the spring 86, the first and second clamp levers 82a, 82b have respective outer ends biased toward the forward end of the hand 64. As a result, the clamp pins 80 push a side edge of the semiconductor wafer W placed on the wafer support arm 70 toward the distal end of the hand 64, thereby pressing the semiconductor wafer W against the guide pins 76 to clamp the semiconductor wafer W on the wafer support arm 70. The thick proximal end portion 69 has a stop pin 90 mounted thereon to limit the movement of the inner end of the second clamp lever 82b toward the proximal end of the hand 64.

A release pin 92 projecting downwardly from the hand 64 is mounted on the second clamp lever 82b near its inner end. When the hand 64 has moved to a certain position, the release pin 92 is engaged and pushed by an unclamping member 94a (see FIG. 12) that is positioned outside of the hand 64, thus pressing the inner end of the second clamp lever 82b toward the distal end of the hand 64 against the bias of the spring 86 for thereby unclamping the semiconductor wafer W. The unclamping member 94a is positioned at a given height at the inlet of each of the load-lock chambers 36a, 36b. The unclamping member 94a has a tapered surface 95 for pushing the release pin 92 when the hand 64 moves forward into each of the load-lock chambers 36a, 36b.

Figure 12:
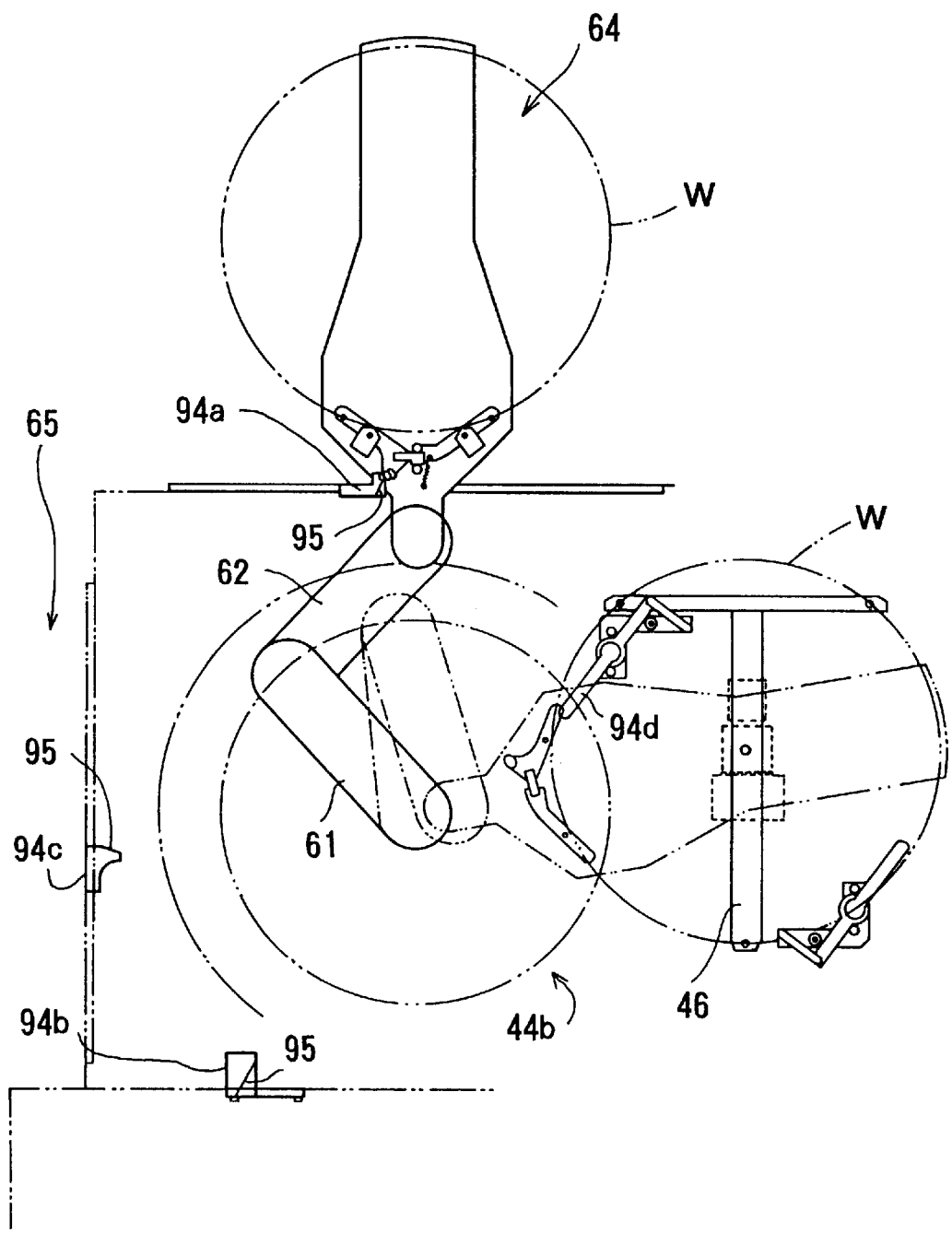
FIG. 12 is a view showing the manner in which the feed robot feeds a substrate.

As shown in FIG. 12, an unclamping member 94b is positioned between each of the feed robots 44a, 44b, and the corresponding substrate transfer position 34, and an unclamping member 94c is positioned at the inlet of the buffer chamber 65. The relay table 46 has an unclamping member 94d which, as shown in FIG. 5, is mounted on a distal end of a rod extending horizontally from a distal end of a vertical column 96 mounted on the bottom wall 54 of the vacuum chamber 10. The unclamping member 94d is normally biased in a direction opposite to the direction in which the hand 64 moves forward, by a spring 98 connected to a proximal end of the vertical column 96. The unclamping member 94d serves to contact the distal end of the second clamp lever 82b directly to open the second clamp lever 82b.

As indicated by the solid lines in FIG. 12, the feed robots 44a, 44b move their hands 64 into positions beneath semiconductor wafers W stored in the cassettes 40a, 40b in the load-lock chambers 36a, 36b. As each of the hands 64 moves forward, the tapered surface 95 of the unclamping member 94a pushes the release pin 92 inward, thus opening the clamp levers 82a, 82b and the clamp pins 80. Each of the cassettes 40a, 40b is lowered to transfer the semiconductor wafer W onto the wafer support arm 70 of the hand 64. When the hand 64 is retracted, the clamp levers 82a, 82b and the clamp pins 80 return to their clamping position under the bias of the spring 86. The clamp pins 80 engage a side edge of the semiconductor wafer W, thereby clamping the semiconductor wafer W between the clamp pins 80 and the guide pins 76.

The feed robot 44b which has clamped and stably held the semiconductor wafer W extends or turns the arms 61, 62 to feed the semiconductor wafer W to a position above the relay table 46, as indicated by the imaginary lines in FIG. 12. As the hand 64 moves forward, the distal end of the unclamping member 94d pushes the release pin 92 inward, thereby opening the clamp levers 82a, 82b and the clamp pins 80. The air cylinder 56 shown in FIG. 5 is operated to lift the relay table 46 for thereby causing the holder rods 48 to elevate the semiconductor wafer W off the hand 64. Thereafter, the hand 64 is retracted away from the relay table 46.

The semiconductor wafer W held by the relay table 46 is then held by the other feed robot 44a and transferred to the substrate transfer position 34. In the substrate transfer position 34, the semiconductor wafer W is transferred to the substrate holding robot 18b whose substrate holder base 26 is empty. Then, the semiconductor wafer W held by the substrate holding robot 18b is transferred to the beam exposure position 16, in which ions are implanted into the semiconductor wafer W. During this time, the feed robot 44b takes out a next semiconductor wafer W from the load-lock chamber 36b, and delivers the semiconductor wafer W directly to the substrate holding robot 18a without going to the relay table 46. The semiconductor wafer W held by the substrate holding robot 18a is then transferred to the beam exposure position 16, in which ions are implanted into the semiconductor wafer W. The processed semiconductor wafers W are returned to the cassette 40b in the load-lock chamber 36b directly or via the buffer chamber 65.

Since the hand 64 has the clamp mechanism C for securely holding a semiconductor wafer W, the hand 64 can quickly be moved and can also reliably transfer a semiconductor wafer W to another device. The hand 64 itself does not have an actuator mechanism for unclamping the semiconductor wafer W carried thereby. Thus, the hand 64 may be relatively light in weight. Consequently, the mechanical strength of the arms 61, 62 may be reduced, and the actuator mechanism of the arms 61, 62 may be lowered in performance level. Inasmuch as a semiconductor wafer W is supported on the wafer support arm 70 by the four support pins 74, the amount of particles that are produced by physical contact between the semiconductor wafer W and the support pins 74 is small, and hence any contamination of the semiconductor wafer W with those particles can be reduced.

With the feed robots 44a, 44b shown in FIGS. 10 through 12, the clamp mechanism is opened and closed by the forces that are exerted by the feed robots 44a, 44b to actuate their hands 64. Therefore, the hands 64 themselves are not required to have an actuator mechanism for unclamping the semiconductor wafers W carried thereby. The feed robots 44a, 44b are thus able to clamp and unclamp semiconductor wafers W with a relatively simple structure, and can feed semiconductor wafers W at an increased speed.

The substrate holder base 26 of each of feed robots 44a, 44b will be described below with reference to FIGS. 13, 14, 18, and 19.

Figure 13:
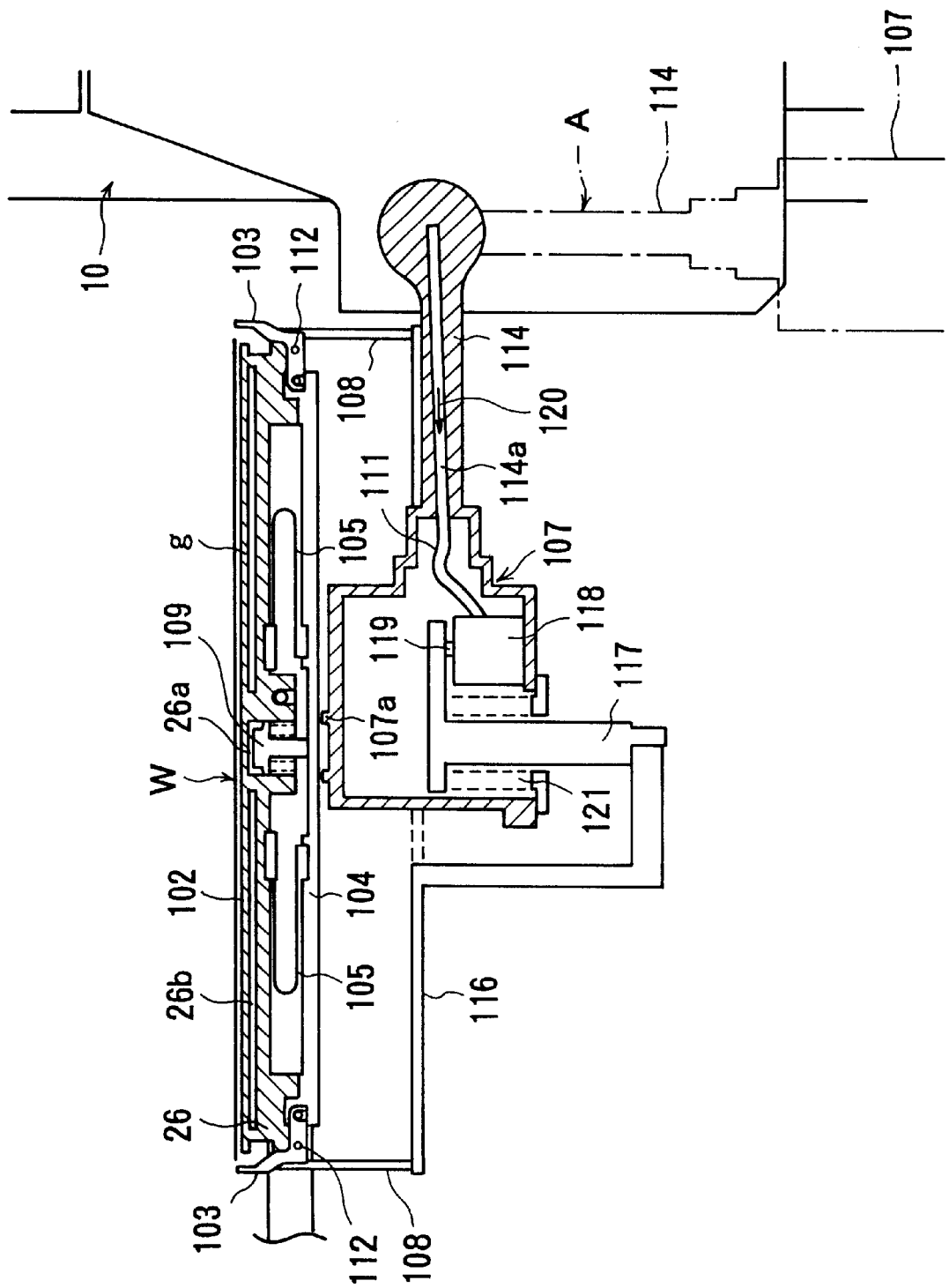
FIG. 13 is a cross-sectional view of a substrate holder base of the feed robot.

As shown in FIGS. 13 and 14, the substrate holder base 26 supports thereon an electrostatic chuck 102 for attracting and holding a semiconductor wafer W on its substrate holding surface under electrostatic forces generated by the electrostatic chuck 102. The substrate holder base 26 has a substrate cooling mechanism for cooling a semiconductor wafer W supported on the substrate holding surface thereof. Specifically, the substrate holding surface of the substrate holder base 26 has a gas outlet hole 26a defined therein for supplying a gas under a pressure ranging from 1 to 5 Torr to form a gas film "g" in a gap between the substrate holding surface and the semiconductor wafer W held thereon.

The electrostatic chuck 102 has a substrate attracting surface 102c (see FIG. 19) having therein radial grooves 102a communicating with the gas outlet hole 26a and concentric circular grooves 102b communicating with the radial grooves 102a. The gas which has passed through the gas outlet hole 26a flows through the radial grooves 102a and the concentric circular grooves 102b.

As shown in FIGS. 13 and 18, the substrate holder base 26 has a zigzag coolant passage 26b defined therein for being supplied with a coolant at a rate ranging from 5 to 10 liters/min. The coolant passage 26b has an inside diameter of 6 mm. The gas film "g" filled in the gap between the substrate holding surface and the semiconductor wafer W held thereon serves as a thermal conductive medium for cooling a semiconductor wafer W which has been heated upon implantation of ions into the semiconductor wafer W. Since the gap is kept in a vacuum while ions are being introduced into the semiconductor wafer W in the vacuum chamber 10, heat would not otherwise be radiated well from the semiconductor wafer W. Because the gas film "g" is produced in the gap, the gas film "g" can radiate heat well from the semiconductor wafer W.

As shown in FIG. 13, the substrate holder base 26 is of a circular shape (see FIG. 14) and has a plurality of (four in the illustrated embodiment) clamp fingers 103 mounted on a circumferential edge thereof by respective pivot shafts 112 for angular movement about the pivot shafts 112. The clamp fingers 103 have distal ends for abutting against a circumferential edge of a semiconductor wafer W, and opposite proximal ends connected to a clamp lever 104. The clamp lever 104 is normally biased in a direction to move away from the substrate holder base 26 by a leaf spring 105 disposed between the clamp lever 104 and the substrate holder base 26. Thus, the clamp fingers 103 are normally urged to be closed, i.e., to press the circumferential edge of the semiconductor wafer W under the bias of the leaf spring 105.

In FIGS. 13 and 14, the substrate holder base 26 is associated with a substrate lifting mechanism 107 for operating the clamp fingers 103 and also lifting a semiconductor wafer W. The substrate lifting mechanism 107 is supported by an arm 114 which is angularly movable by a shaft 113 extending through a side wall of the vacuum chamber 10. The substrate lifting mechanism 107 is normally stored or retracted in contact with an inner surface of the vacuum chamber 10. When the arm 114 is angularly moved by the shaft 113, the substrate lifting mechanism 107 is lifted off the inner surface of the vacuum chamber 10. A magnetic fluid seal 115 (see FIG. 14) is disposed around the shaft 113 in the side wall for hermetically isolating interior of the vacuum chamber 10 from the exterior thereof.

Pins 108 are disposed on the circumferential edge of the substrate holder base 26 respectively adjacent to the clamp fingers 103. The pins 108 are mounted on respective ends of pin levers 116 connected by a lifter 117 to a piston 119 in an air cylinder 118 which is disposed in the substrate lifting mechanism 107. The lifter 117 has a portion slidably disposed in the substrate lifting mechanism 107 and enclosed by a bellows 121. The arm 114 has a compressed air passage 114a defined therein and connected to the air cylinder 118. Compressed air 120 supplied from an external source of compressed air, disposed outside of the vacuum chamber 10, is supplied through the compressed air passage 114a and a flexible tube 111 to the air cylinder 118. The substrate lifting mechanism 107 has a plurality of protrusions 107a on an upper surface thereof for engaging the clamp lever 104.

Figure 15:
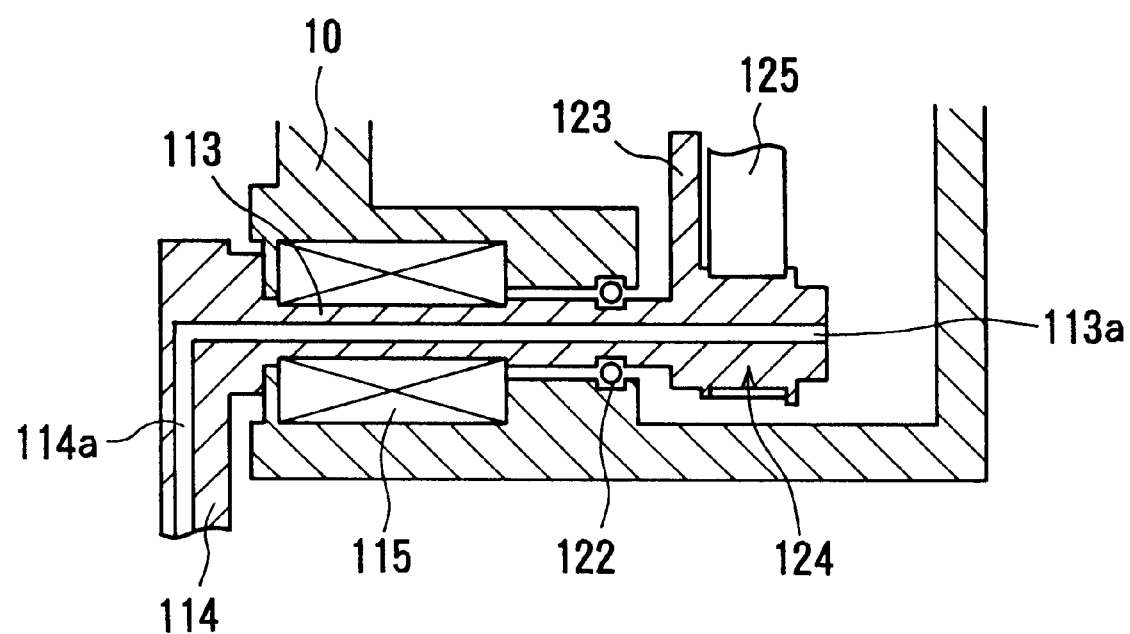
FIG. 15 is a fragmentary cross-sectional view of a shaft of an actuator of a substrate lifting mechanism.
Figure 16:
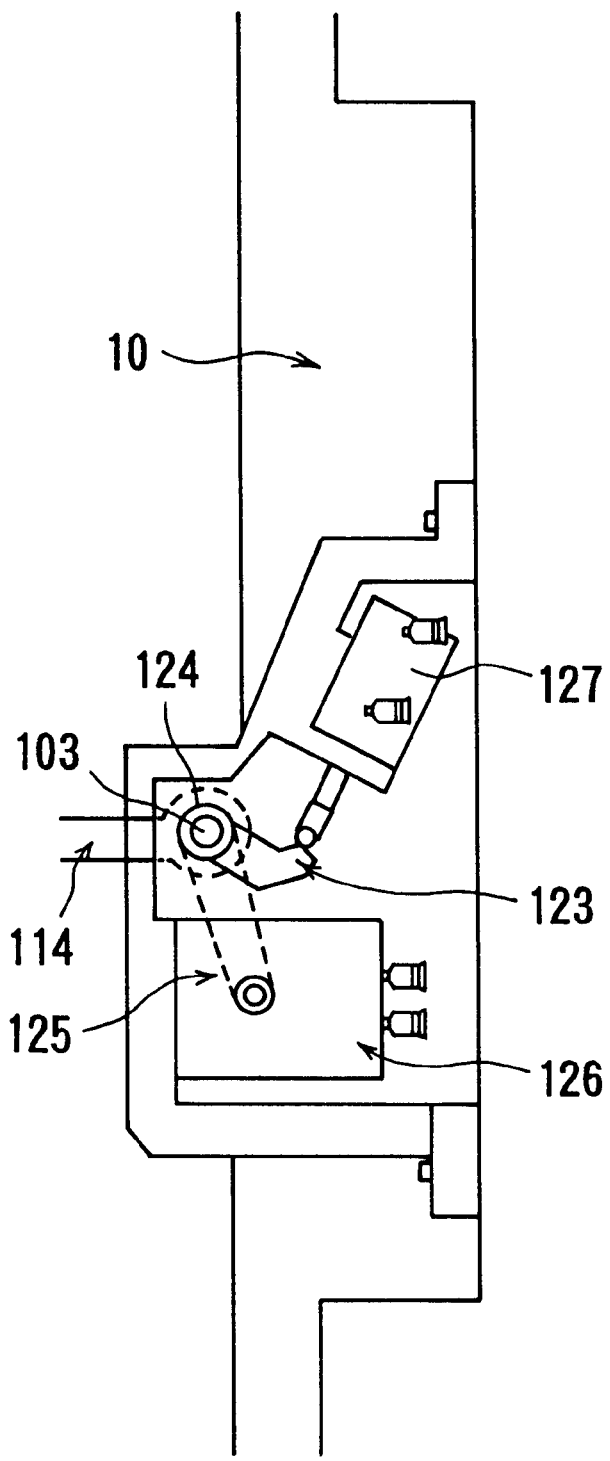
FIG. 16 is a side elevational view of the actuator of the substrate lifting mechanism.

FIGS. 15 and 16 show an actuator of the substrate lifting mechanism 107. As shown in FIGS. 15 and 16, the actuator has a shaft 113 angularly movably supported in a side wall of the vacuum chamber 10 by a magnetic fluid seal 115 and a ball bearing 122. The magnetic fluid seal 115 serves to hermetically isolate the interior of the vacuum chamber 10 from the exterior thereof. The shaft 113 has a stopper 123 and a pulley 124 mounted on an end thereof. A timing belt 125 is trained around the pulley 124. The shaft 113 has a compressed air passage 113a defined therein which communicates with the compressed air passage 114a in the arm 114, so that compressed air from the external source of compressed air can be supplied to the compressed air passages 113a, 114a.

As shown in FIG. 16, the timing belt 125 is provided between the pulley 124 and the drive shaft of a rotary actuator 126. Therefore, the shaft 113 can be turned about its own axis by the rotary actuator 126. The stopper 123 can be pushed by the drive shaft of an air cylinder 127. When the drive shaft of the air cylinder 127 pushes the stopper 123, the shaft 113 can further be turned about its own axis.

For placing an unprocessed semiconductor wafer W on the substrate holder base 26 of each of the substrate holding robots 18a, 18b, the first and second movable arms 21, 23 are extended or contracted to move the substrate holder base 26 on the distal end of the second movable arm 23 to the substrate transfer position 34 shown in FIG. 1A. Then, the feed robot 44a or 44b takes out a semiconductor wafer W from the load-lock chamber 36a or 36b, and transfers the semiconductor wafer W to the position above the substrate holder base 26. Thereafter, the rotary actuator 126 is operated to turn the shaft 113 about its own axis to angularly move the arm 114 upwardly about the shaft 113 and to elevate the substrate lifting mechanism 107 into a position underneath the substrate holder base 26, as shown in FIG. 13.

When the air cylinder 127 is actuated, the arm 114 is further angularly moved upwardly to bring the protrusions 107a of the substrate lifting mechanism 107 into abutment against the clamp lever 104, thus lifting the clamp lever 104. The clamp fingers 103 are now turned in an opening direction about the pivot shafts 112.

Then, the air cylinder 118 is operated to push upwardly the pins 108 on the ends of the pin levers 116. The tip ends of the four pins 108 are brought into contact with the lower surface of the semiconductor wafer W over the substrate holder base 26 near its circumferential edge thereof, thus slightly lifting the semiconductor wafer W off the feed robot 44a or 44b. After the feed robot 44a or 44b is retracted, the pins 108 are lowered to allow the semiconductor wafer W to be placed onto the substrate holder base 26 between the opening clamp fingers 103. Then, the rotary actuator 126 and the air cylinder 127 are operated to lower the arm 114 whereby the substrate lifting mechanism 107 is retraced from the position directly below the substrate holder base 26 to a position A in FIG. 13 on an inner wall surface of the vacuum chamber 10.

At this time, the clamp lever 104 is pushed away from the substrate holder base 26 by the leaf spring 105, thus closing the clamp fingers 103 to laterally push the circumferential edge of the semiconductor wafer W, which is now held on the substrate holder base 26. When the clamp fingers 103 are brought into contact with the circumferential edge of the semiconductor wafer W, the semiconductor wafer W is grounded via the clamp fingers 103, and at the same time a bias voltage ranging from 500 V to 1500 V is applied to the electrostatic chuck 102, which is of a single-pole type. The electrostatic chuck 102 now starts attracting the semiconductor wafer W under electrostatic forces (Coulomb forces). Therefore, the semiconductor wafer W is mechanically held by the clamp fingers 103 and also electrostatically attracted by the electrostatic chuck 102.

Figure 20:
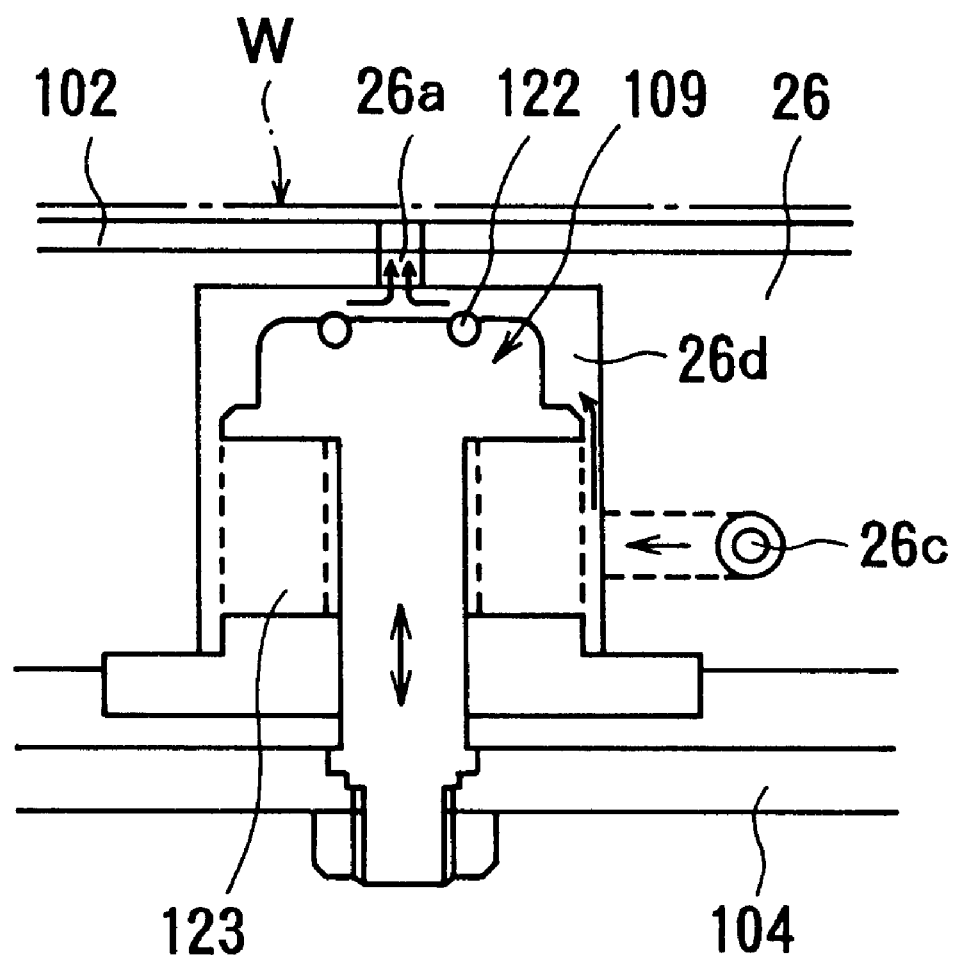
FIG. 20 is a fragmentary side elevational view of a gas supply valve of a substrate cooling mechanism of the substrate holder base.

The substrate cooling mechanism includes a bellows-type gas supply valve 109 which is disposed immediately near the gas outlet hole 26a in the substrate holder base 26. As shown in FIG. 20, an O-ring 122 is mounted on a tip end of the gas supply valve 109, which is connected to the clamp lever 104. When the clamp lever 104 is lifted by the protrusions 107a of the substrate lifting mechanism 107, the O-ring 122 is pressed against a surface of the substrate holder base 26 around the gas outlet hole 26a, thus stopping the discharge of the gas from the gas outlet hole 26a.

Conversely, when the clamp lever 104 is lowered, the O-ring 122 is spaced from the surface of the substrate holder base 26 around the gas outlet hole 26a, thus allowing the gas to be ejected from the gas outlet hole 26a.

Specifically, the holding of the semiconductor wafer W with the clamp fingers 103 and the electrostatic chuck 102, and the starting of the supply of the gas into the gap between the substrate holding surface of the substrate holder base 26 and the semiconductor wafer W are operated in unison each other. The releasing of the semiconductor wafer W from the clamp fingers 103 and the electrostatic chuck 102, and the stoppage of the supply of the gas into the gap between the substrate holding surface of the substrate holder base 26 and the semiconductor wafer W are also operated in unison with each other. The gas is supplied from a gas inlet hole 26c defined in the substrate holder base 26 into a valve chamber 26d defined in the substrate holder base 26 and housing the gas supply valve 109. Then, the gas flows from the valve chamber 26d through the gas outlet hole 26a into the gap between the substrate holding surface of the substrate holder base 26 and the semiconductor wafer W. The gas supply valve 109 has a slidable shank covered with a bellows 123.

When ions are implanted into the semiconductor wafer W in the beam exposure region 16, the semiconductor wafer W is heated. The heated semiconductor wafer W is sufficiently cooled by the coolant supplied to the coolant passage 26b in the substrate holder base 26 and the gas film "g" produced as a thermally conductive medium by the gas supplied to the gap between the substrate holding surface of the substrate holder base 26 and the semiconductor wafer W. The electrostatic chuck 102 is effective to apply sufficient pressing forces to the semiconductor wafer W in its entirety.

Each of the substrate holding robots 18a, 18b moves the semiconductor wafer W held by the substrate holder base 26 to the beam exposure region 16 in front of the ion current detector 20. In the beam exposure region 16, while the semiconductor wafer W is being moved perpendicularly to the ion beam 12, the ion beam 12 is applied to the semiconductor wafer W to introduce ions into the semiconductor wafer W. The substrate holding robots 18a, 18b translate the respective semiconductor wafers W perpendicularly to the ion beam 12 while ions are being implanted into the semiconductor wafers W.

Figure 17:
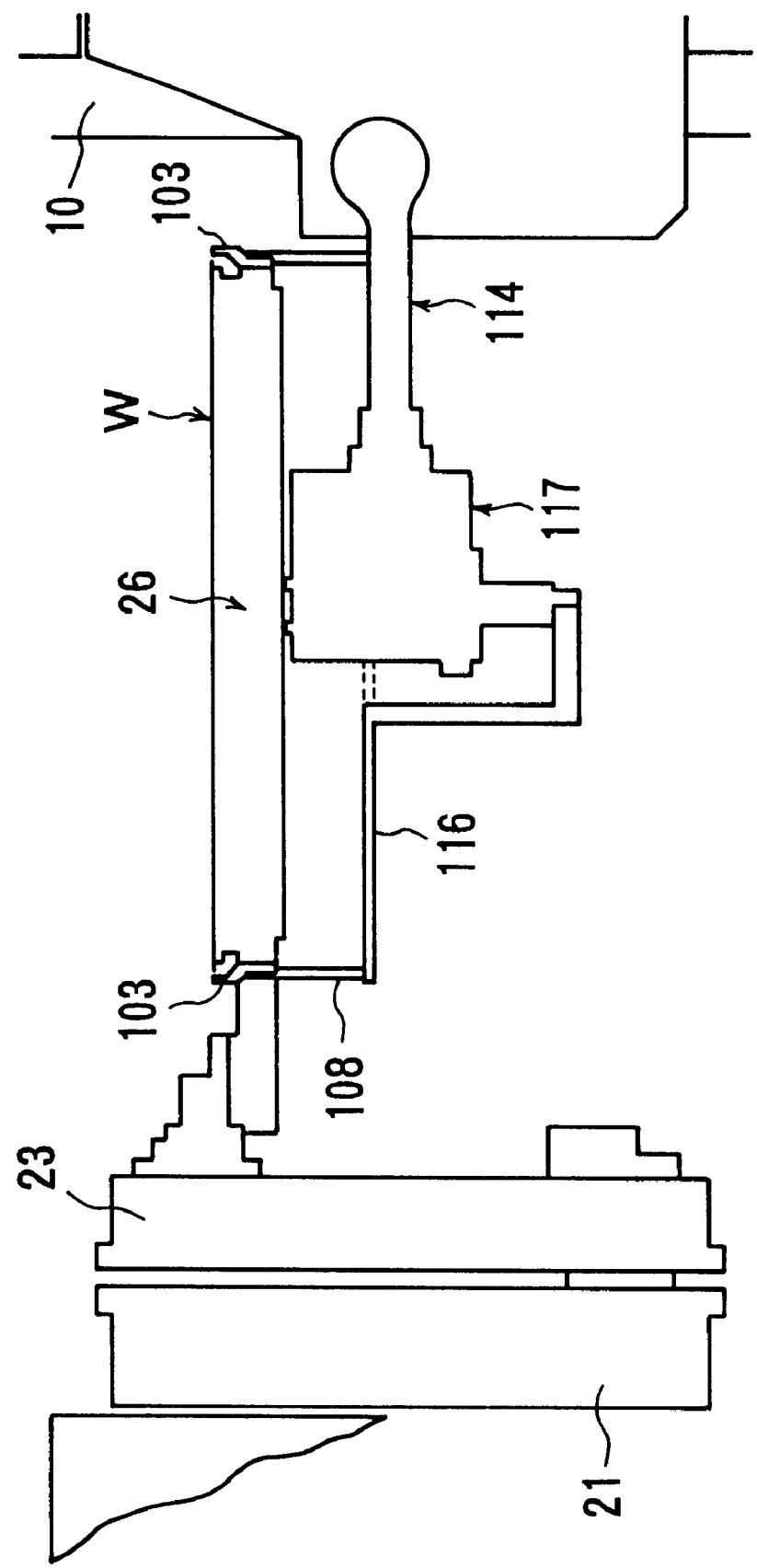
FIG. 17 is a view showing the relationship between the arms of the substrate holding robot and the substrate holder base.
Figure 19:
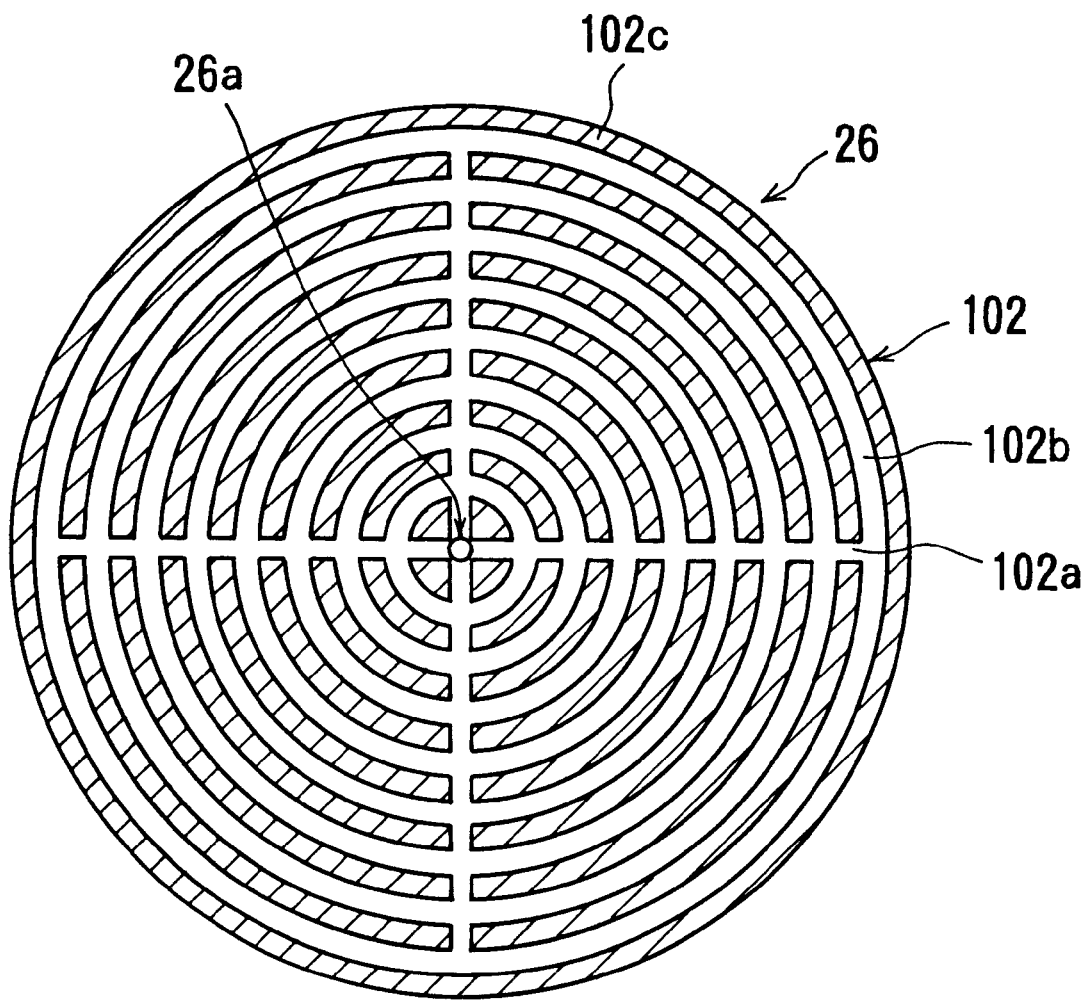
FIG. 19 is a sectional plan view of an attracting surface of an electrostatic chuck in the substrate holder base.

After ions have been implanted into the semiconductor wafers W, each of the substrate holding robots 18a, 18b allows the substrate holder base 26 on the second movable arm 23 to move to the substrate transfer position 34 shown in FIG. 1, turns the arm 114 about the shaft 113 to lift the substrate lifting mechanism 107, and operates the air cylinder 127 to bring the protrusions 107a into abutment against the clamp lever 104 to open the clamp fingers 103, as shown in FIG. 17. Then, the air cylinder 118 is operated to project the tip ends of the pins 108 above the substrate holding surface of the substrate holder base 26 for thereby lifting the semiconductor wafer W off the substrate holding surface. The lifted semiconductor wafer W is received by the feed robot 44a or 44b.

As described above, unless a semiconductor wafer W is placed on or removed from the substrate holder base 26, the arm 114 can be turned to retract the substrate lifting mechanism 107 against the inner wall surface of the vacuum chamber 10. Therefore, a space is made available in the vacuum chamber 10 for the substrate holder base 26 to be turned to the beam exposure region 16. The substrate holding robots 18a, 18b may be arranged in a wide layout space, and the substrate holder base 26 may be turned in a wide space. By utilizing the space in which the substrate lifting mechanism 107 is retracted, the ion implanter may be made compact.

As described above with reference to FIGS. 13 through 17, the various devices including the substrate lifting mechanism 107 and other components for placing a semiconductor wafer W on and removing a semiconductor wafer W from the substrate holder base 26 are separate from the substrate holding robots 18a, 18b. Therefore, the substrate holding robots 18a, 18b may be made small in size and light in weight though the substrate holder base 26 can perform its desired functions. Unless a semiconductor wafer W is placed on or removed from the substrate holder base 26, the substrate lifting mechanism 107 can be retracted against the inner wall surface of the vacuum chamber 10. By utilizing the space in which the substrate lifting mechanism 107 is retracted, the ion implanter may be made compact.

According to the embodiment shown in FIGS. 13 through 20, a semiconductor wafer W is securely held on the substrate holder base 26 mechanically by the clamp fingers 103 and electrostatically by the electrostatic chuck 102 while ions are being introduced into the semiconductor wafer W. The substrate holder base 26 incorporates the substrate cooling mechanism for cooling the semiconductor wafer W with the gas supplied to the gap between the substrate holder base 26 and the semiconductor wafer W. The gas film "g" produced by the gas supplied to the gap between the substrate holder base 26 and the semiconductor wafer W serves as a thermally conductive medium for effectively cooling the semiconductor wafer W that has been heated by ions introduced thereinto.

When a semiconductor wafer W is placed on or removed from the substrate holder base 26 by the clamp fingers 103 and the electrostatic chuck 102, the gas simultaneously starts or stops being supplied to the gap between the substrate holder base 26 and the semiconductor wafer W. Therefore, the placing of the semiconductor wafer W on the substrate holder base 26 or the removal of the semiconductor wafer W from the substrate holder base 26 is performed simultaneously with the starting or stopping of the supply of the gas to the gap between the substrate holder base 26 and the semiconductor wafer W.

Although a certain preferred embodiment of the present invention has been shown and described in detail, it should be understood that various changes and modifications may be made therein without departing from the scope of the appended claims.

What is claimed is:

1. An ion implantation apparatus comprising:

a vacuum chamber;

a beam exposure region defined in an end of said vacuum chamber;

a substrate holding robot disposed near said beam exposure region, for holding a substrate while the substrate is being exposed to a beam in said beam exposure region;

said substrate holding robot comprising two hollow arms joined to each other by a joint, a bearing and a power transmitting mechanism housed in said arms, and an evacuating passage defined in said arms for evacuating said arms to attract particles produced by said bearing or said power transmitting mechanism.

2. An ion implantation apparatus according to claim 1, wherein said joint has a hollow shaft interconnecting spaces in said two hollow arms.

* * * * *